United States Patent [19]

Aoki et al.

[11] Patent Number: 4,701,884
[45] Date of Patent: Oct. 20, 1987

[54] SEMICONDUCTOR MEMORY FOR SERIAL DATA ACCESS

[75] Inventors: Masakazu Aoki, Tokorozawa; Masashi Horiguchi, Kokubunji; Yoshinobu Nakagome, Hachioji; Shinichi Ikenaga, Kokubunji; Katsuhiro Shimohigashi, Musashimurayama; Toshiaki Masuhara, Tokyo; Kiyoo Itoh, Higashikurume; Hideo Nakamura; Osamu Minato, both of Tokyo, all of Japan

[73] Assignee: Hitachi, Ltd., Tokyo, Japan

[21] Appl. No.: 896,257

[22] Filed: Aug. 14, 1986

[30] Foreign Application Priority Data

| Aug. 16, 1985 | [JP] | Japan | 60-179416 |
| Aug. 16, 1985 | [JP] | Japan | 60-179418 |
| Aug. 16, 1985 | [JP] | Japan | 60-179419 |
| Oct. 9, 1985 | [JP] | Japan | 60-223706 |
| Oct. 21, 1985 | [JP] | Japan | 60-233237 |
| Mar. 14, 1986 | [JP] | Japan | 61-54767 |
| Jun. 11, 1986 | [JP] | Japan | 61-133653 |

[51] Int. Cl.$^4$ ............................................. G11C 13/00
[52] U.S. Cl. ................................. 365/189; 365/220; 365/221; 365/238
[58] Field of Search ............... 365/200, 210, 189, 230, 365/233, 221, 220

[56] References Cited

U.S. PATENT DOCUMENTS 4,581,718  4/1986  Oishi ..................................... 365/230
4,635,233  1/1987  Matsumoto et al. ................. 365/230

Primary Examiner—Terrell W. Fears
Assistant Examiner—Melissa J. Koval
Attorney, Agent, or Firm—Antonelli, Terry & Wands

[57] ABSTRACT

A semiconductor memory device is proposed wherein at least an array comprising a plurality of memory cells each having at least one capacity, a select mechanism for specifying the position of each memory cell, data lines connected to said memory cells for transmitting the data and a data writing and a data reading mechanisms are provided. The feature of this device lies in that the voltage generator for serially generating three or more values of the voltage which are different from each other and the means for applying said voltage to said memory cells are provided on the same semiconductor board as the same said memory cells, and as the said reading mechanism the column register is provided which, as said reading mechanism, has the mechanism for deciding the data, transfer gate which is provided between said deciding means and said data line, and the bias charge transfer mechanism which is provided between said transfer gate and said deciding mechanism, and having at least two or more memory elements for temporarily storing said decided data.

26 Claims, 36 Drawing Figures

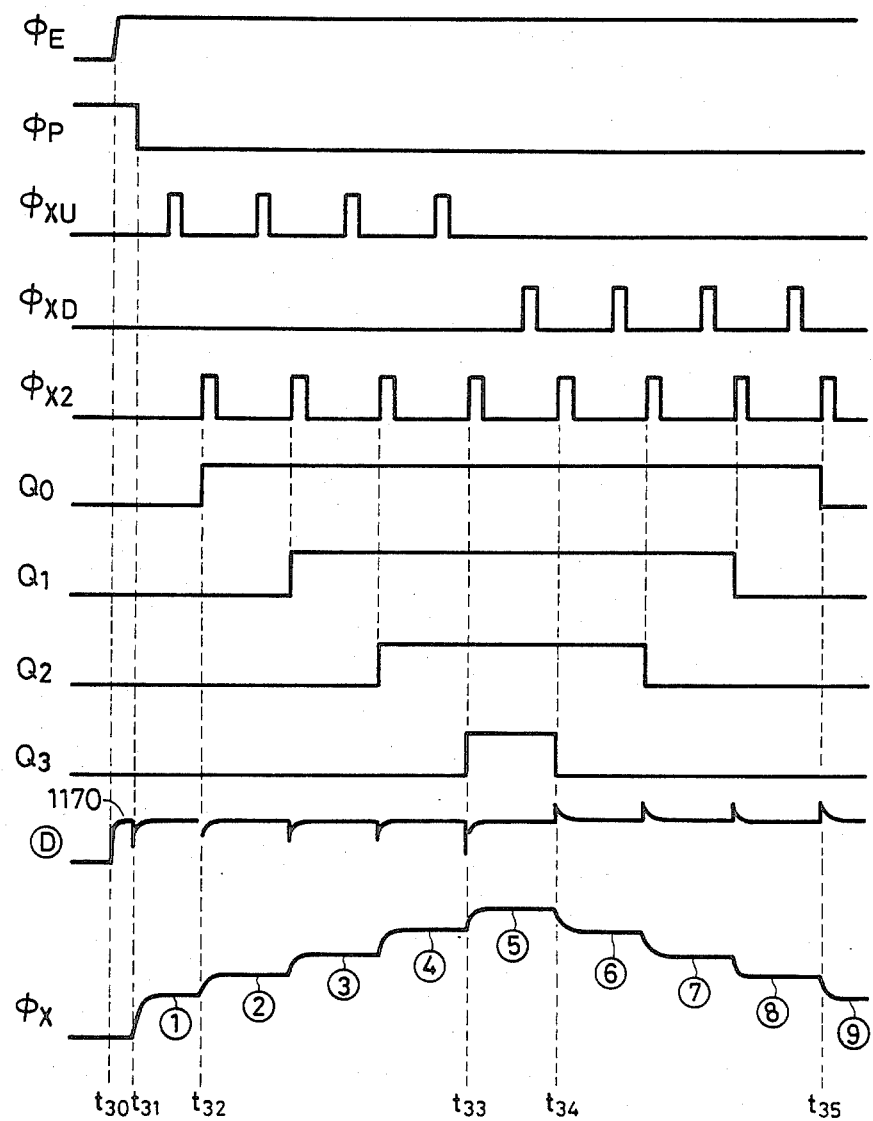

I —— FIRST INVERTER
II —— SECOND INVERTER
III —— THIRD INVERTER

SEMICONDUCTOR MEMORY FOR SERIAL DATA ACCESS

BACKGROUND OF THE INVENTION:

The present invention relates to a semiconductor memory device and more particularly to a semiconductor multilevel memory device which allows the information to be accumulated per unit of the memory on an extremely high storage level even in the case of the low power voltage and the power consumption to be small.

The semiconductor memory which can be represented by the dynamic random access memory (hereinafter abbreviated as DRAM) has been developed year by year with the ever increasing integrated degree and a memory device per unit of the semiconductor memory (hereinafter abbreviated as the memory cell) and a peripheral circuit have been made increasingly fine. However, such improvement of the integration through refinement must be accompanied by the great advance of the element processing techniques such as lithography or etching and as usual a certain amount of time is required for the development of such techniques.

Meanwhile, the demand for the large capacity semiconductor memory has been ever increasing and in the new field of the small size computer for use in the offices and its terminal which are recently making a remarkable progress, the large capacity and the low power consumption semiconductor has been sincerely cried for. In other words, according to the prior semiconductor memory, it has been said that not only the degree of the integration but also other performances such as the power consumption leave much to be desired.

To meet the above-mentioned demands, of the processing techniques popular at the present time, the memory having multiple level storage structure (MLS memory) is considered to be effective for achieving the more highly integrated semiconductor memory. This is intended for increasing the integration of the memory cell substantially by making a single memory cell store the information comprising three values.

As the MLS memory which has been conventionally known, there is a charge transfer device (hereinafter abbreviated as the CTD). This device is described in detail in, for example, L. Terman et al. IEEE Journal of Solid-State Circuits. Vol. sc-16, No. 5, pp. 472–478, October 1981, M. Yamada et al. Proceedings of the 9th Conference on Solid-State Devices, Tokyo 1977, pp. 263–268, issued on January 1978.

However, up to the present, the MLS memory in which the CTD is used has not yet been put into practical use much. For, to prevent the multilevel data which is intrinsically the analogue signal from being attenuated due to the limited transfer efficiency peculiar to the CTD, the multiple values cannot be increased too much. Or since the driving pulse voltage is necessary to be raised to raise the transfer efficiency, the power consumption is likely to become extremely great apart from it being intrinsically a high capacity loaded device. Furthermore, the high accuracy A/D to D/A converters are necessary for the loop of each CTD, even if the memory cell can be made smaller, the degree of the integration cannot be increased due to the constraint caused by the peripheral circuit.

In view of the above-described disadvantages peculiar to the MLS memory in which CTD is used, the present invention conceived making the dynamic memory (DRAM) in which the addressing is conducted by both rows and columns store multiple values and providing the A/D to D/A converters with the sensing and writing system. If the XY addressing is used, the transfer efficiency need not be taken into consideration and the number of gates which are to be driven is made smaller, reducing the power consumption. However, in order to design the DRAM in the form of the MLS memory, it is necessary to solve the following extremely difficult problems. First, even if the memory cell has stored the multilevel information (analogue signal) having the dynamic range (which is divided into the multilevel information) ranging up to the maximum 5 $V_{pp}$, for example, since the capacity of the parasitic data line is often larger by one position or thereabove than the capacity of the memory cell, the dynamic range below the maximum 500 m $V_{pp}$, for example, results when that data is read out onto the data line. It is extremely difficult to load a multiplicity of A/D converters on the chip for accurately amplifying such small analogue signal and converting it into the digital value, except for the case where the number of levels of the multiple values is small. In particular, it is extremely difficult to provide A/D converters to each data line, unless the pitch of the data line is large.

In this case, note that the MLS memory exhibits an excellent performance as the large capacity memory only when memory cells equal to or above the ordinary memory storing the binary number are provided on the chip of an equal or larger size. Namely, if the amount of charges of the signal of the single memory cell in the current DRAM is $Qs'$, if the manufacturing processing technique is the same, the amount of charges of the signal which is allowed to the single level of the MLS memory having the N-multiple value, approximately becomes $Q'N$, which is the extremely stringent condition. Accordingly, XY addressing type MLS memory simultaneously needs an amplifier which allows the minute signal to be accurately amplified and an A/D converter which is compact and has a high accuracy. The lack of such possibility of obtaining those devices has left the MLS memory of this sort aside.

The invention has achieved the novel XY addressing type MLS memory, as described in the European patent application Publication No. 130614, 139196 and 148488, and achieved a large capacity semiconductor memory in which the power consumption is small.

The above-described memory having the multiple level storage structure (MLS memory) has a novel minute voltage amplifier which is suited to the large capacity memory and A/D to D/A converters which are extremely simple and low in the power consumption and yet highly accurate, having the peripheral circuit having the low power consumption. Thanks thereto, it has become possible to replace the magnetic disc unit which requires the large volume and the large power consumption by the semiconductor memory in the small size computer system.

SUMMARY OF THE INVENTION

An object of the present invention is to provide the memory which allows the data to be serially read out from the memory portion.

The present invention relates to an improvement of the MLS memory of the XY addressing type which the inverter has previously completed and particularly provides a serially reading and writing system using the MLS memory.

Another object of the present invention is to provide various circuits which are to be disposed around the periphery of the memory array of the MLS memory, i.e. read circuits, write circuits, defect recovery circuits, encoders-decoders, square wave generators, timing generators or the like.

A still further object of the invention is to provide a means for controlling the operation of the MLS memory and a method of controlling the timing of the operation of the MLS memory.

These and other objects and many of the attendant advantages of this invention will be readily appreciated as the same becomes better understood by reference to the following detailed description when considered in connection with the accompanying drawings.

The semiconductor memory according to the present invention is composed of arrays composed of a plurality of memory cells each having at least one unit capacity, a selective means for specifying the position of each memory cell, data lines for transmitting the information for being connected to above-described memory cell and a mechanism for writing and reading the information which is connected to the data line and the above selective means is provided with at least a means for sequentially selecting memory cells in the predetermined order and terminals are provided performing the input and the output of data in synchronized relation with the clock signal which is applied from the exterior, so that the signal indicating the completion of the preparation of the input and the output of data.

The preferred embodiment according to the present invention is hereinafter described, but the content of the European patent application Publication No. 130614, 139196 and 148488 disclosed previously by inventors is also incorporated within the present invention.

BRIEF DESCRIPTION OF THE DRAWINGS

FIG. 21 shows a view illustrating the waveforms of the driving pulses and the output of the analogue signal.

DESCRIPTION OF THE PREFERRED EMBODIMENTS

The present invention is hereinafter described in accordance with the preferred embodiment. Although, in the following embodiment, data is carried and stored by the operation of electrons used as signal charge carriers, even if the holes are used for the same purpose, the same embodiment can be applied in completely the same manner by reversing the polarity of the power supply or the pulse and the conductive type of the semiconductor.

Figure 1:
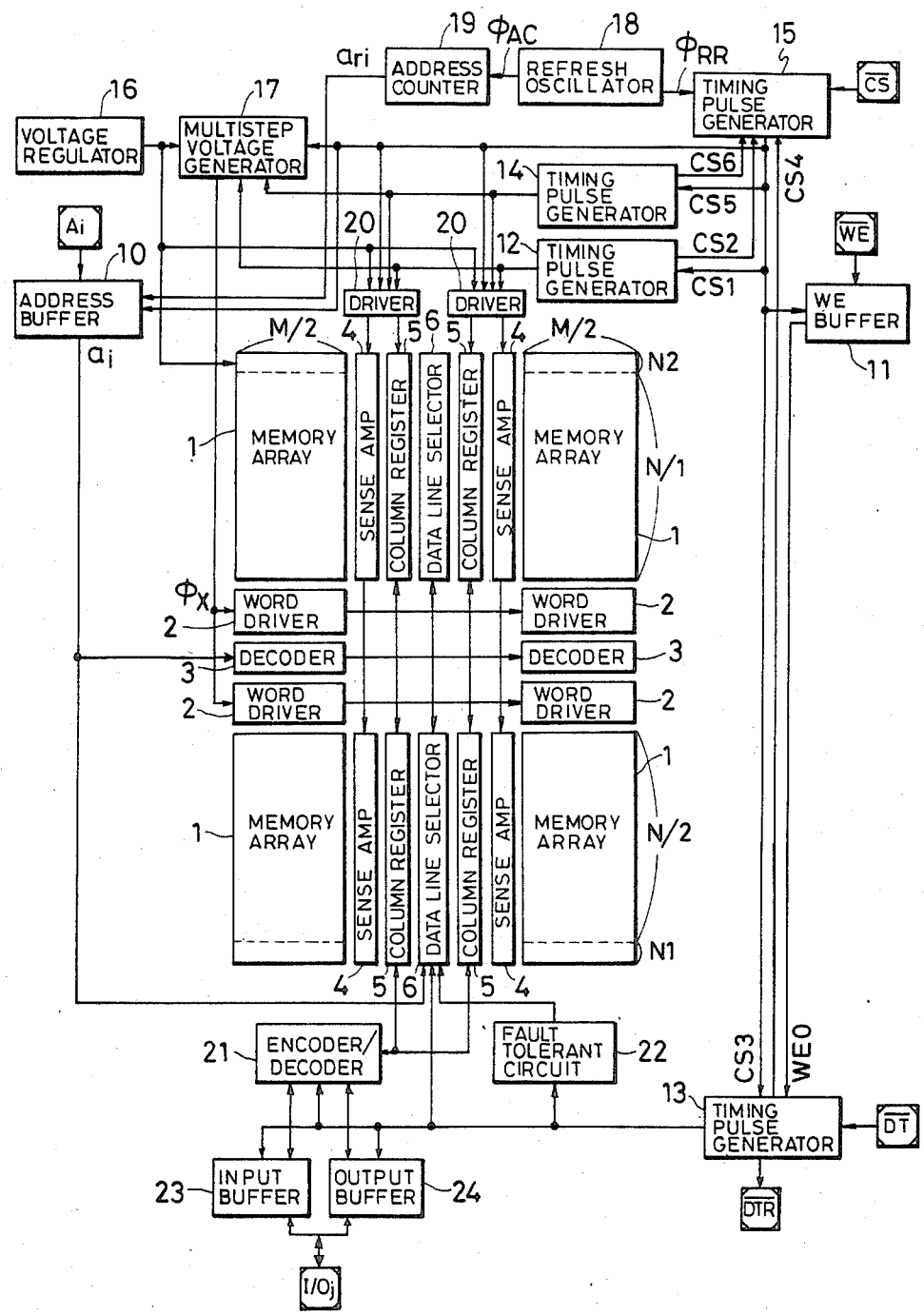
FIG. 1 shows a block diagram illustrating the preferred embodiment according to the present invention.

FIG. 1 shows a block diagram of the construction of the one embodiment of the MLS memory accordint to the present invention. In the same figure, reference numeral 1 shows a memory array in which memory cells are disposed, 2 a word line driving circuit, 3 a decoder, 4 a sense circuit for amplifying the signal which was read out from the memory cell, 5 a column register (temporary storage cells) for temporarily storing the multilevel data of the memory cell in the form of the binary (digital) information, 6 a data line select circuit (data line selector), 10 an address buffer, 11 a WE (write enable signal) buffer, 12, 13, 14 and 15 a timing pulse generator, 16 a voltage regulator, 17 a multilevel step voltage generator, 18 an oscilator for the refresh control, 19 an address counter for imparting the refresh address, 21 an encoder/decoder of the error correcting code (ECC), 22 a fault tolerant circuit, 23 an input buffer and 24 an output buffer.

Figure 2:
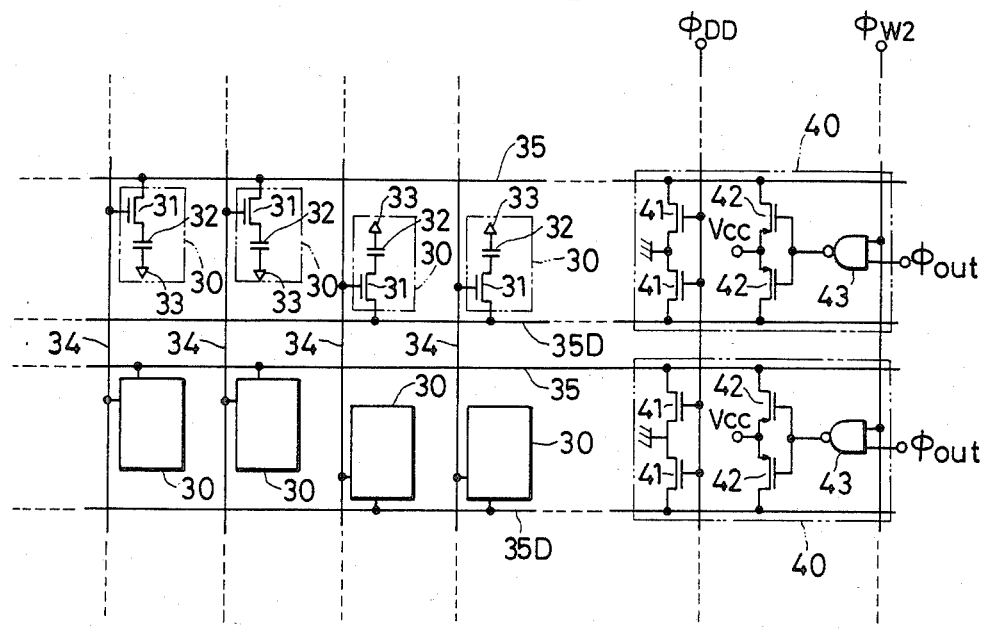
FIG. 2 shows a circuit diagram illustrating the detail of the memory array.

The memory array 1 is shown in detail in FIG. 2. The memory cell 30 is composed of a MOS transistor 31 and a storage capacitor 32 which are the same as used in the dynamic RAM (DRAM). This storage capacitor may be provided on the plane of the substrate, or trenched into the substrate, or stacked onto the substrate. However, in the case of the DRAM, one bit information "0" or "1" is stored depending on whether charges are accumulated in the storage capacitor 32, while, in the case of this memory, the storage capacitor 32 varies the amount fo electric charges in q manners (q≧3), so that the q-level data amounting to "0", "1", "2" ..., "q-1" may be stored. For example, if q=16, 4-bit information can be stored within a single memory cell, as a result of which the integration four times as dense as in the DRAM can be realized. Incidentally, reference numeral 40 is a circuit for writing the multilevel data to the memory cell. (for the operation to be described later)

This memory has four memory mats each of which comprises memory cells M/2×N/2. (however, in this case, redundant data lines amounting to N1 for the purpose of the fault tolerance to be described later and N2 for the correction of the errors are provided.)

Consequently, the entire memory capacity results as follows:

$$\log_2 q \times \frac{M}{2} \times \frac{N}{2} \times 4 = MN \log_2 q \text{ (bit)}$$

For example, if M=N=1024 and q=16, the amount of total bits per chip becomes 4 M bits. In this memory, memory cells on the left and right mats are each selected by one, so that the 2 $\log_2 q$ bits may be totally read out and written.

Namely, the number of data input/output terminals I/O j amounts to 2 $\log_2 q$. When the writing and reading unit is multiplied by the integer times by the $\log_2 q$ bits, the control may be simplified.

Figure 3:
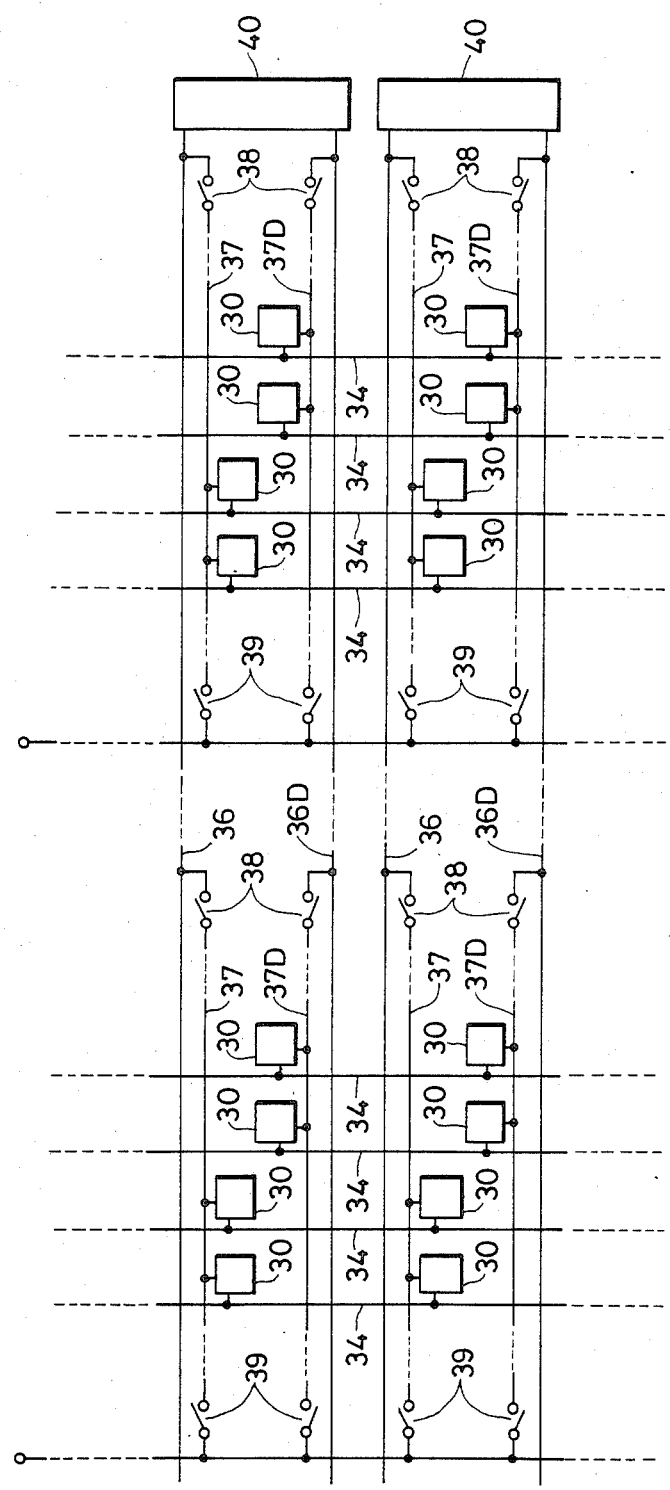
FIG. 3 shows a circuit diagram illustrating another embodiment of the construction of the memory array.

FIG. 3 shows another embodiment of the memory array 1. The feature of this embodiment resides in the division of the data lines into S-pieces. Namely, the intermediate portion between main data lines 36 running throughout the memory array and data lines to which the memory cells are connected is turned on or off by a switch 38. Of data lines 37, only a single one to which the selected memory cell is connected is connected to the main data lines 39 and the rest of them (S-1) is connected to the power supply $V_L$ by the switch 39.

One of the advantages obtained by such division of data lines lies in the small capacity of the data. For example, when the two-level-layer interconnection is used, main data lines are wired by the upperlayer (second layer) and data lines are wired by the lower layer (first layer), so that the second layer interconnection having a relatively small capacity may travel throughout the memory array and the first layer interconnection may contribute to the parasitic data line capacitance by a half thereof (1/S), which allows the entire capacitance to be reduced.

Another advantage lies in the fact that the coupling capacitance between the data line and the plate electrode of the memory cell or between the data line and the circuit board becomes small. As described later, during the operation of the memory, the potential of the entire data lines may be varied at the same time and at this time if the potentials of the plate electrode or the circuit board is fluctuated due to the coupling capacitance, noise can result. In view of the fact that the amount of the signal of this memory is small compared with the prior DRAM, such a design in which the noise can be reduced is preferred. If, as described above, data lines are divided, the fluctuation of the potential caused by the coupling capacitance can be approximately set to ½.

The memory array shown in FIGS. 2 and 3 each relate to those used in the folded bit lines system, but even in the case of the open bit lines system, the invention can be applied. However, in reducing the noise, the folded bit lines system is desirable.

Next, how the multilevel data is read out and written is described. In the following description, it is assumed that the number of the levels of the multilevel data q be equal to 4 (i.e. 2 bits information are stored within a single memory cell.).

Figure 4:
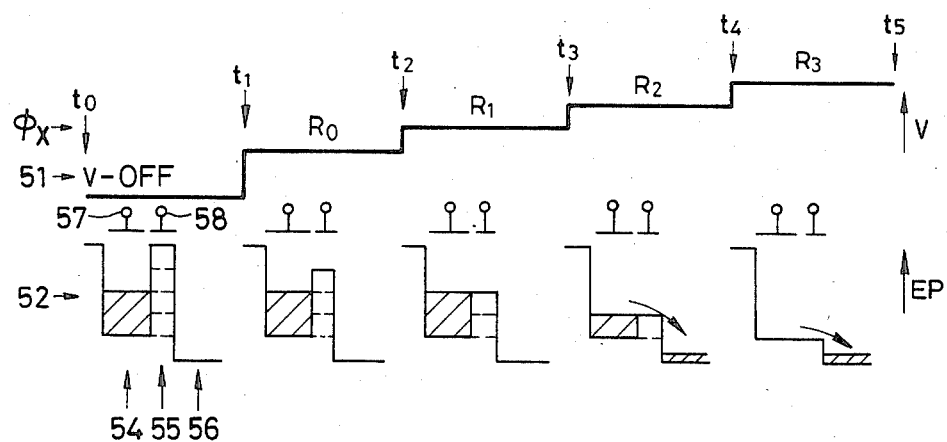
FIG. 4 shows an explanatory view of the reading operation of the multilevel information.

FIG. 4 shows an explanatory view of the operation during reading the multilevel data. In the figure, reference numeral 51 is a stepped voltage pulse $\phi_X$ which is applied to the word line 34. 52 is a potential of the memory cell with respect to the electrons, 54 a storage capacitance 32, 55 a MOS transistor 31, 56 a position corresponding to each potential of the data line 35, the upper direction thereof showing a direction the potential of which is higher (the potential is low). 57 shows a plate electrode 33 and 58 a gate of the MOS transistor 31.

Let us assume that the level "2" ("10" in the binary information) is stored within the memory cell. The stepped voltage pulse $\phi_X$ applied to the word line 34 is sequentially elevated in correspondence to the time $t_1$, $t_2$, $t_3$, ... No signal charges emerge during $t_1$ to $t_3$, while they are respectively read out onto the data line 35 (or 37) during $t_3$ to $t_4$ and $t_4$ to $t_5$. The signal thus readout is amplified by the sense circuit 4 and is fed to the column register 5. Since no signal charges are read out during $t_1$ to $t_2$ and $t_2$ to $t_3$, the "vacant" information is fed and since the signal charge is read out during $t_3$ to $t_4$ and $t_4$ to $t_5$, the "existing" information is fed. The column register 5 stores those informations. (The detail of the column register is to be described later.)

The feature of the above multilevel data read system resides in that, after the signal charge emerged from the memory cell, the electric charge packet carries only the binary information comprising "existing" and "vacant", while the multilevel data is effectively carried during timings $t_1$ to $t_5$ when the column register and the stepped voltage pulse are controlled. As a result, the signal voltage on the data lines requires no amplification of the analogue values with a high accuracy, but can be treated as the binary information such as the ordinary memory. Consequently, no large scale and great power circuits, which can serve as the obstacle to realizing the densely integrated memory, is necessary and the ULSI memory having a low power consumption can be realized.

Figure 5:
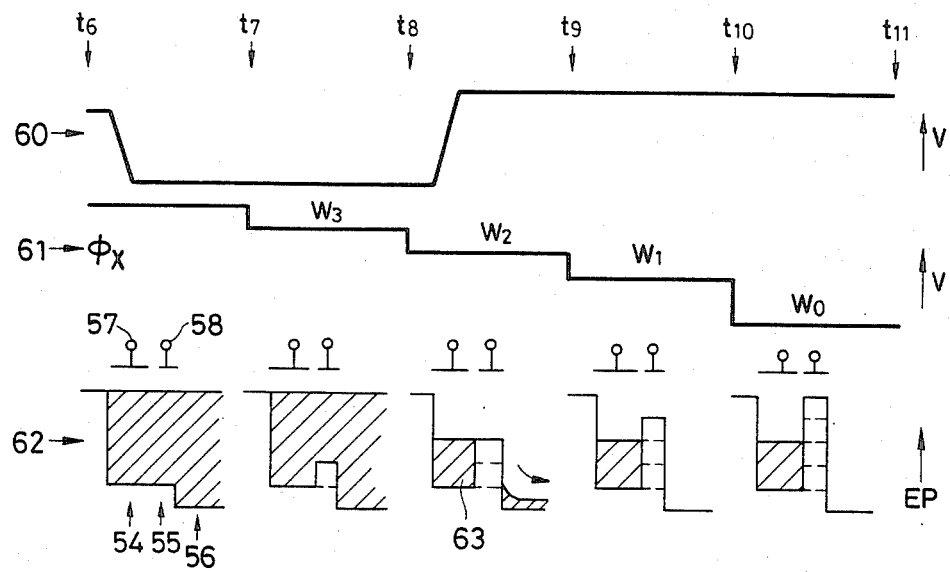
FIG. 5 shows an explanatory view of the writing operation of the multilevel information.

FIG. 5 is an explanatory view of the operation at the time of writing of the multilevel data. In the figure reference numeral 60 denotes a voltage of the data line 35 (or 37). 61 a stepped wave voltage pulse which is applied to the word line 34, 62 a potential of the memory cell 30 with respect to the electrons, and positions 54 to 56 and electrodes 57 and 58 are the same as in FIG. 4.

In writing data, first, the data line reset signal $\phi_{DD}$ is set to the high level to make the reset MOS transistor 41 electrically conductive, so that the data line may be set to the low level (in this case, OV) ($t_6$ to $t_7$). If the level "2" is written, when the pulse $\phi_X$ has reached ($t_8$ to $t_9$), the data line is raised to the high potential via the writing MOS transistor 42. This timing is selected in accordance with the output of the column register 5 and the timing signal $\phi_{W2}$. Thanks thereto, the level "2" is left to the memory cell, as shown by 63. In this case, too, since writing of the multilevel data is conducted in accordance with the timing ($t_7$ to $t_{11}$), the construction of the circuit is extremely simple and the high rate of integration is possible and the power consumption is also small.

A marked feature of the write and read mechanism as shown in FIGS. 5 and 4 resides in the fact that, since writing and reading of data into and from data storage capacitance are conducted via the same MOS transistor 31, the amount of signal charges corresponding to a single level is not practically varied depending on the positions, unless the level of the pulse $\phi_X$ is varied depending on the position. Namely, if the storage capacitance, the threshold voltage of the MOS transistor 31 and the pulse $\phi_X$ at the time of writing and the pulse $\phi_X$ at the time of reading are assumed respectively to be $C_S$, $V_{ThS}$, $V_W$ and $V_R$, since the voltage $V_S$ of the storage capacitance when the data was written is equal to $V_W - V_{ThS}$ and $V_S$ after the data was read out is equal to $V_R - V_{ThS}$, the amount of electric charges of the signal which is to be read out Q is as follows.

$$Q_S = C_S\{(V_R - V_{ThS}) - (V_W - V_{ThS})\} = C_S(V_R - V_W)$$

Consequently, if the backgate bias effect is small, $Q_S$ becomes constant independantly of $V_{ThS}$. Accordingly, even if the threshold voltage $V_{ThS}$ of the memory cell has a local distribution, the amount of the electric charges of the signal is approximately constant, which allows a high accuracy judgement of data. This is extremely important because, in the MLS memory having a deep level (many levels) of the multilevel value, the level of the stepped voltage of the pulse $\phi_X(\Delta\phi_X)$ is set to, for example, below 200 mV, i.e. to the level adjacent the distribution of the threshold voltage within the chip of the MOS LSI.

Figure 6:
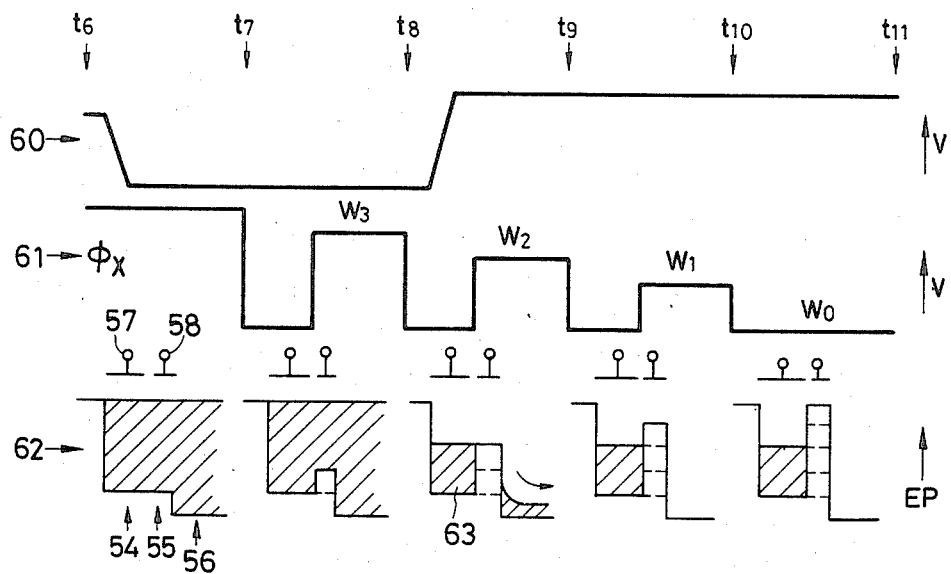
FIG. 6 shows an explanatory view of another method of writing the multilevel information.

FIG. 6 shows an explanatory view of the other method of writing the multilevel data. This differs in the method of driving the word line from FIG. 5. Namely, in this figure, when the pulse $\phi_X$ is trailed, it is once lowered to the low level (for example 0 V) and thereafter set to the new level. Leading of the data line for writing data is conducted during the time when $\phi_X$ is set to the low level. The advantage obtained by this method lies in the excellent stability of the operation. Namely, if, when the data line is made to rise, the potential of the word line rose by the data line and the word line and the capacitance coupling, the potential (position 55) below the gate of the MOS transistor 31 and a portion of the electric charges flow out. If the potential of the word line is previously set to the low level (namely the potential is high), even if the potential had risen more or less, no charges flow out, which allows an accurate writing of the level. This is especially effective when the impedance of the word line is high.

To achieve this method of driving the word line, the voltage having a waveform as shown in FIG. 6 may be generated in the stepped wave generator, but the output of the stepped wave generator may be a waveform shown in FIG. 5, so that the word line may be lowered to the low level by temporarily setting the decoder 3 to the non-selected state.

Figure 7:
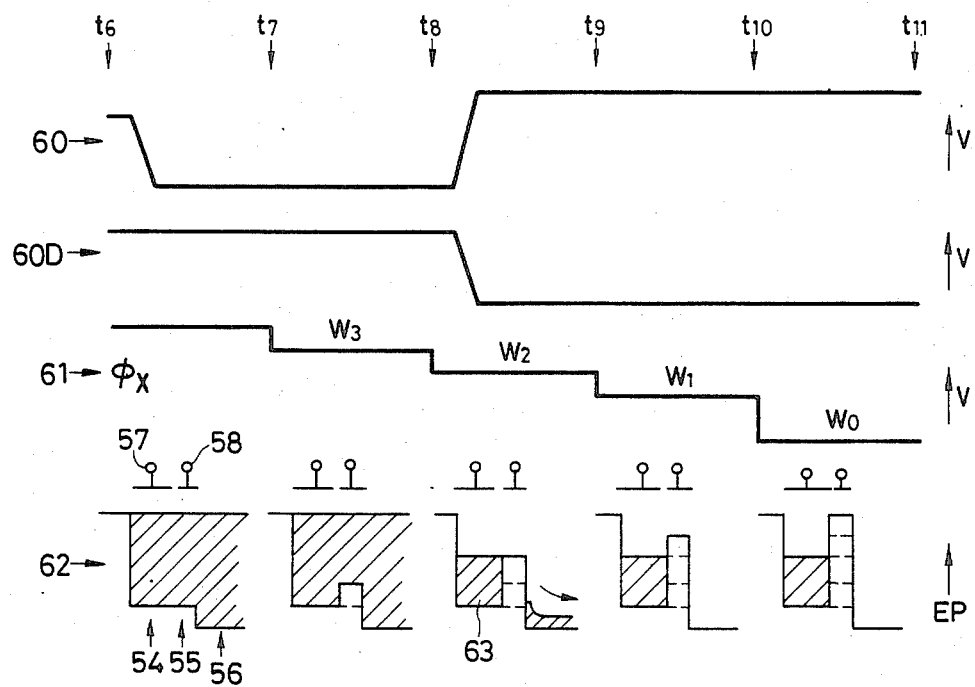
FIG. 7 shows an explanatory view of a still another method of writing the multilevel information.

FIG. 7 shows an explanatory view of a still another method of writing the multilevel data. This differs in the data line driving method from FIG. 5.

Namely, in the case of FIG. 5, data lines 35 and 35D are simultaneously trailed and risen, while, in this Figure, only the side where the selected memory cell is connected is trailed and risen as shown by 60 and the opposite side is trailed at the timing of the writing as shown by 60D. The advantage of this method lies in the excellent stability of the operation as in the case of FIG. 6. Namely, since potentials at the side of the memory cell of the data line and at the opposite side are moved each other in the opposite directions, the effect of the capacitance coupling between itself and the word line is offset and the fluctuation of the potential of the word line becomes smaller. Consequently, the amount of the flow out of the electric charges 63 is small and the accurate writing of the level is realized. Furthermore, since the effect of the capacitance coupling between the data line and the plate electrode is also similarly offset, the fluctuation of the potential of the plate electrode becomes smaller and the stable operation is realized.

Figure 8:
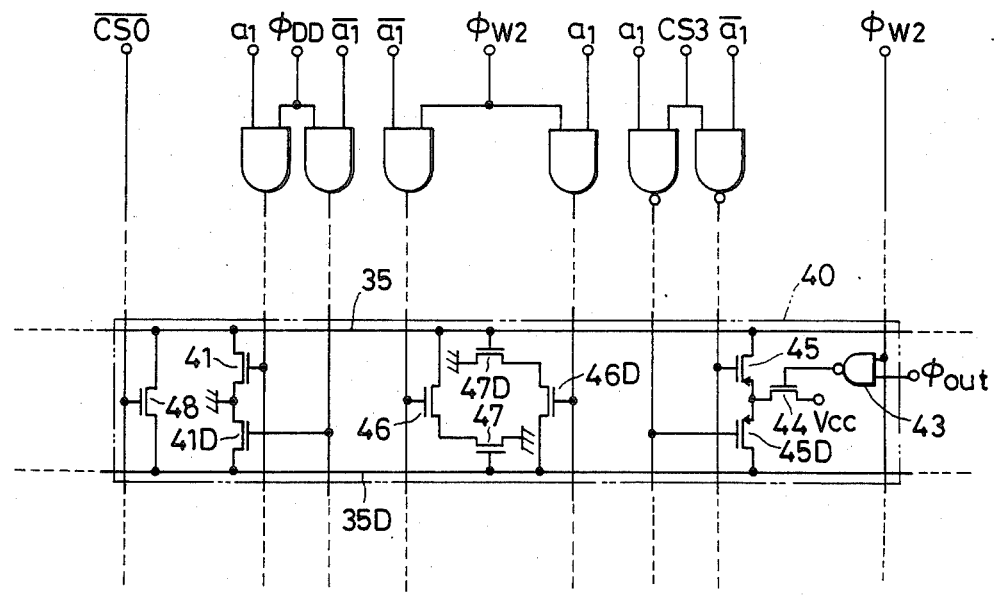
FIG. 8 shows a view illustrating the write line.

Incidentally, to achieve the method of driving this data line, the construction of the write circuit 40 may be altered for example, as shown in FIG. 8. In this circuit, potentials of 35 and 35D are controlled by the signal indicating at which side (side 35 or side 35D) the selected memory cell is disposed (address signals $a_1$ and $\overline{a_1}$ in this case). For example, when the selected memory cell is present at the side 35, the signal $a_1$ is on the high level and the signal $\overline{a_1}$ is on the low level. At the reset of the data line, since the MOS transistor 41 is electrically conductive and 41D is non-conductive, the potential of the data line rises only at the side 35. At the time of writing, since the MOS transistor 45 is electrically conductive and 45D is non-conductive, the potential only at the side 35 of the data line rises. In this case, CS3 is a signal which is set to the high level when the above-described multilevel data is read out and which is set at the high level when the above-described multilevel data is written. When the multilevel data is read out, 45 and 45D are set to the non-conductive state together, so that the imbalance may not occur therebetween. Since 35 is set at the high level and as a result the MOS transistor 47D becomes conductive, 35D is grounded via 46D and 47D. In this case, $\phi_{W2}$ is a signal which is set to the high level only at the time of writing operation.

Figure 9:
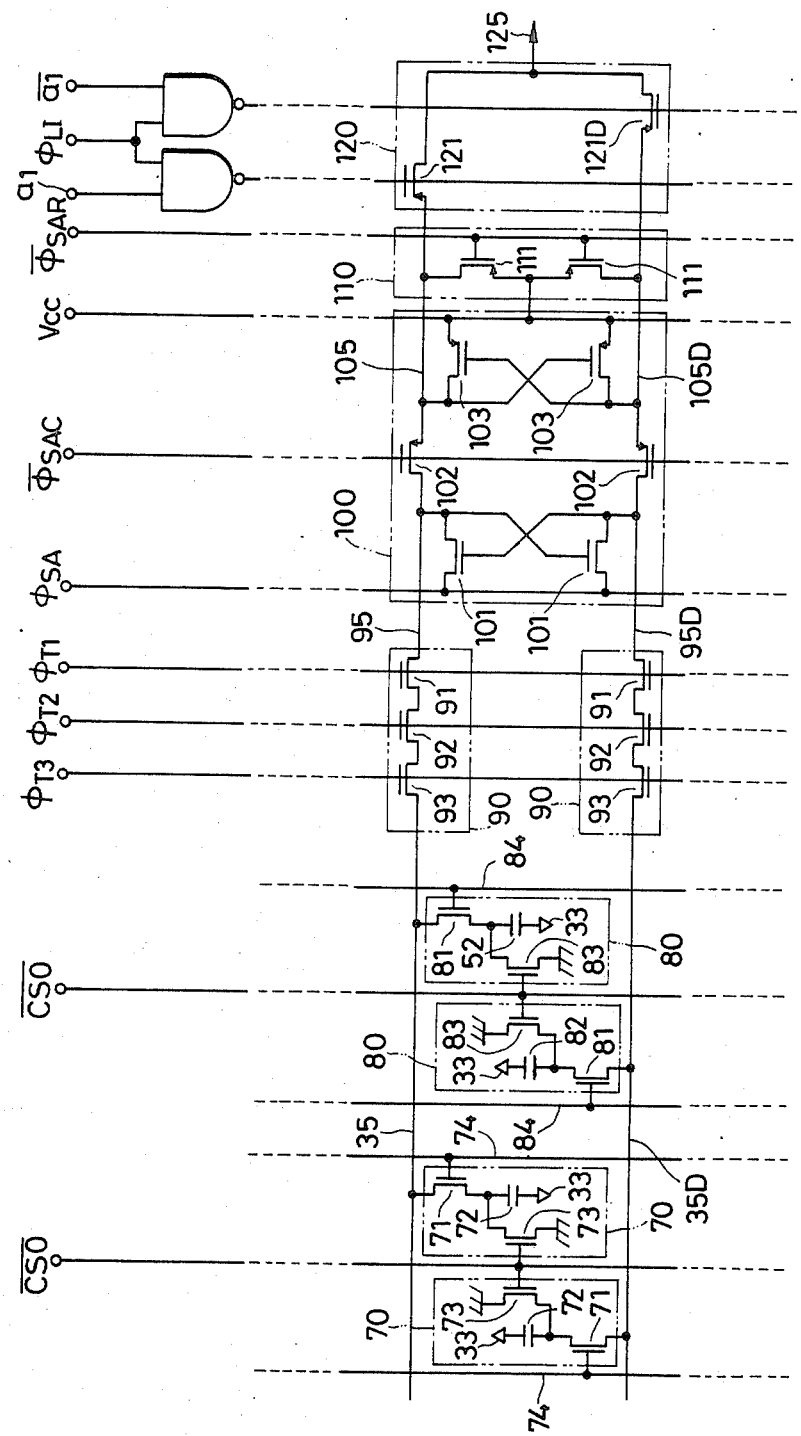
FIG. 9 shows a view illustrating a sensing circuit, FIG. 10 which includes FIG. 10 (A) and FIG. 10 (B) shows an explanatory view of the voltage amplifying operation.

Next, the sense circuit 4 is described. A circuit diagram therefor is shown in FIG. 9. In the same Figure, reference numeral 70 is a dummy cell, 80 a fat-zero cell, 90 a bias charge transfer amplifier (hereinafter abbreviated as BCT amplifier), 100 a sense amplifier, 110 a reset circuit for sensing, and 120 a selecting circuit for sensing line.

The dummy cell 70 is composed of the MOS transistors 71 and 73 and the storage capacitance 72. Reference numerals 71 and 72 correspond respectively to 31 and 32 in the memory cell and the value of the capacitance of 72 is equivalent to the value of the capacitance $C_S$ of 32.

This dummy cell is used for reading out the above-described multilevel data, so that it may impart the reference signal in differentially amplifying the signal read out from the memory cell. After the storage capacitance 72 is grounded via the MOS transistor 73, the stepped wave pulse $\phi_{XH}$ is applied to one of the word lines 74 of the dummy cell in synchronized relation with the stepped wave pulse $\phi_X$ which is applied to the word line of the memory cell. At this time, if the selected memory cell is connected to the side 35 of the data line, the dummy cell at the side 35D must be selected and if it is connected to the side 35D, the dummy cell at the side 35 must be selected. The stepped voltage $\Delta\phi_{XH}$ of the stepped wave pulse $\phi_{XH}$ is set approximately to one half of the stepped voltage $\phi_X$ of the stepped wave pulse which is applied to the memory cell. As a result, electric charges $C_S \cdot \Delta\phi_{XH} = C_S \cdot \Delta\phi_X/2$ are read out everytime from the dummy cell. Since the amount of electric charges of the signal which is read out from the memory cell is $C_S \cdot \Delta\phi_X$ (in case of "existing") or zero (in the case of "vacant"), the amount of electric charges intermediate "existing" and "vacant" is read out from the dummy cell, which can be used as the reference value in amplifying the signal differentially.

The feature of this method lies in that the value of the storage capacitance 72 of the dummy cell may be equivalent to that of the storage capacitance 32 of the memory cell. In designing the dummy cell, the value of the storage capacitance of 72 may be set approximately to one half of 32 and in place thereof the stepped voltages of the stepped wave pulse which is applied may be made equal to each other, but if the distribution of the processing quality is taken into consideration, it is not necessarily easy to set the ratio of the capacitance between 72 and 32 (1:2). In contrast, according to this method, since 72 and 32 having the same shape can be used, even in the presence of the distribution of the processing quality, it is easy to make their values of the capacitances equal to each other and the reference signal in differentially amplifying the signal can be accurately formed.

The BCT amplifier 90 is composed of two charge transfer MOS transistors 91 and 93 and the bias charge driving depletion type MOS transistor 92. This is a circuit for amplifying the voltage by transferring electric charges to the input terminal 95 (95D) of the sense amplifier. The operation is hereinafter described in accordance with FIG. 10.

First, data lines 35 and 35D are set to a sufficiently low voltage. For that purpose, in case the circuit as shown in FIG. 2 is used as the write circuit, the data line may be grounded via the reset MOS transistor. In case the circuit shown as 40 in FIG. 8 is used, 35 and 35D may be short-circuited by the MOS transistor for short-circuiting the data line. Since one of 35 and 35D is set to zero volt and the other to the power voltage $V_{CC}$ after the preceding writing has been completed, $V_{CC}/2$ results due to the short circuit.

Figure 10A:
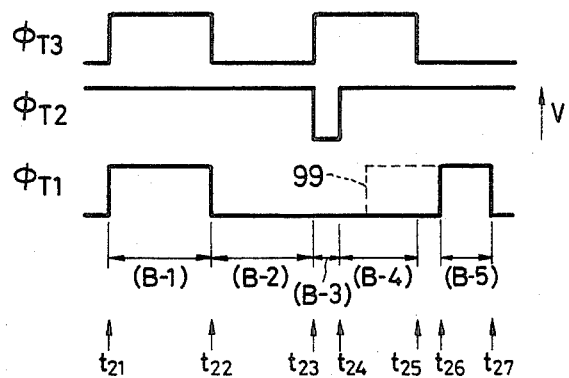
Figure 10B:
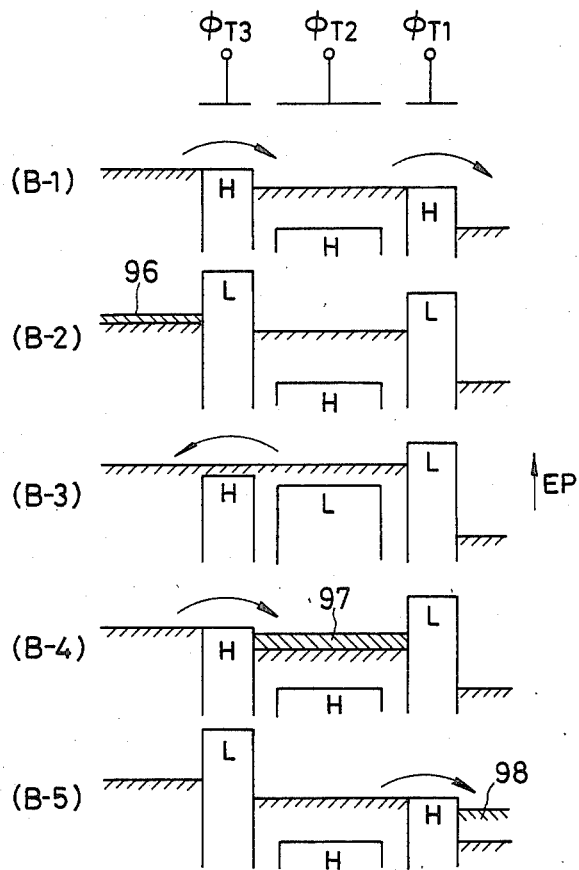

Next, $\phi_{T3}$ and $\phi_{T1}$ are set to the high level and $\overline{\phi_{SAC}}$ and $\overline{\phi_{SAR}}$ to the low level and the potential of data lines 35 and 35D is set to $V_{T3H} - V_{Th3H}$ via MOS transistors 111 and 102 and 91 to 93 (See FIG. 10 (B-1)). In this case, by $V_{T3H}$ is meant a high level voltage of the pulse $\phi_{T3}$ which is applied to the MOS transistor 93 and by $V_{ThT3}$ a threshold voltage (including the backgate bias effect) of 93. Besides, at this time the amount of the biased charges which is stored to the inversion layer of the MOS transistor 92 is set. Next, after $\phi_{T3}$ and $\phi_{T1}$ are set to the low level, as described above, electric charges of the signal 96 are read out from the memory cell and the dummy cell to data lines 35 and 35D (See FIG. 10 (B-2)). Next, $\phi_{T3}$ is set to the high level and $\phi_{T2}$ is set to the low level, so that the biased charges may be transferred to the data lines 35 and 35D (See FIG. 10 (B-3)). Since the capacitance of the data line is considerably large compared with that of the MOS transistor 92, the biased charges are transferred for the most part to the side of the data line. At this time, the biased charges are mixed with the charges of the signal. Next, the pulse $\phi_{T2}$ is set to the high level and the mixed charges are taken into the inversion layer of the MOS transistor 92 (FIG. 10 (B-4)). Furthermore, the pulse $\phi_{T3}$ is set to the low level and the pulse $\phi_{T1}$ to the high level, so that the electric charges may be transferred to the input terminals 95 and 95D of the sense amplifier (FIG. 10 (B-5)). At this time, since pulses $\phi_{T1}$ and $\phi_{T2}$ are in the same state as when the biased charges are set (FIG. 10 (B-5)), biased charges are not transferred, but only the signal charges are transferred as shown by 98.

The timing of the driving pulse is shown in FIG. 19(A). For reading out the multilevel data, it is necessary to repeat the above-described charge transfer process by q or q-1 times, but the portion of $t_{22}$ to $t_{27}$ may be repeated for that purpose.

Since the level of the driving pulse in particular of $\phi_{T3}$ and $\phi_{T1}$ requires a high accuracy, it is desirable to use the stabilized voltage regulated by the voltage regulator 16.

The reason why the minute charges on the large capacitance $C_D$ can be efficiently transferred to the small capacitance C (capacitance of the MOS transistor 92) is as follows.

Namely, if the MOS transistor 93 is usually in the cut-off state, since, even when the minute signal has come onto the data line as shown by 96, the amplitude of the voltage is small, the current does not practically flow below the MOS transistor 93. This is because 93 is in the tailing current mode on the extremely low level. In contrast if the biased charges are fed onto the data line, the extremely large current flows and 99% of the charges, for example, are transferred to the inversion layer of the MOS transistor 92. These charges include also the signal charges approximately by 99%. If the biased charges are subtracted by the MOS transistor 91, signal charges can be transferred with an extremely excellent efficiency to the input terminal 95 of the sense amplifier.

A significant point of the above charge transfer operation is that the transfer of the signal charges is conducted by each gate at the saturation mode of operation, as shown in (B-4) and (B-5). If that is conducted at the non-saturation mode, the transfer of the signal charges cannot be sufficiently conducted due to the division of the capacitance.

In place of the timing t 26 when $\phi_{T1}$ is set to the high level timings $t_{24}$ to $t_{25}$ when $\phi_{T3}$ is set to the high level may be chosen as shown by 99. In that case, the signal charges are transferred at a time from the data line via the inversion layer of the MOS transistor 92 to the input terminal of the sense amplifier. The advantage of this method lies in that, even when the capacitance of 92 is relatively small, the signal charges overflows to the inversion layer, so that the MOS transistor 93 may be prevented from being non-saturated.

Figure 11:
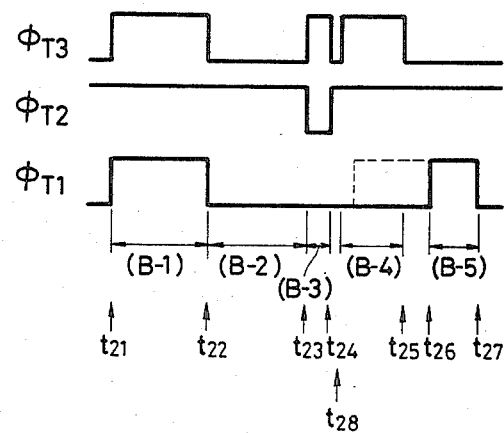
FIG. 11 shows a view illustrating another driving method.

Another driving method is shown in FIG. 11. This differs from FIG. 10, (A) in that $\phi_{T3}$ is once lowered to the low level at the timing $t_{24}$ when $\phi_{T2}$ is set to the high level. The feature of this method lies in that the elevated voltage caused by the start of the transfer of charges from the data line to the inversion layer of the MOS transistor 92 can be prevented from being transmitted via the gate capacitance of the MOS transistor 93 to the gate. This is especially effective when the impedance of the wiring of the gate of 93 is high.

In this case, though, to drive the biased charges, the depletion type MOS transistor 92 is used, it need not necessarily be the MOS capacitance, but the fixed capacitance, e.g. the capacitance stacked on the field may be used.

Next, the fat-zero cell 80 is described. This is similarly constructed as the dummy cell 70, but the difference is that stepped wave pulse $\phi_{XF}$ are applied simultaneously to two fat-zero word lines 84. By so doing, the fat-zero charges $Q_F$ other than the signal charges are injected each time to data lines 35 and 35D. Consequently, the sum of the signal charges and the fat-zero charges is transferred to the input terminal 95 and 95D of the sense amplifier and at this time the fat-zero charges play the role to raise the transfer efficiency of the MOS transistor 91 in the same way as the above-described bias charges raises the transfer efficiency of the MOS transfer 93. Since these fat-zero charges are equally applied to both of 95 and 95D, they do not exert an effect on the operation of the differential amplifier.

As described above, by using the BCT amplifier and the fat-zero cells, it becomes possible to transfer the signal charges with an extremely high efficiency from the data line to the input terminal of the sense amplifier. Their voltage is amplified by $C_D/C_A$ time by the transfer action. (By $C_A$ is meant the input capacitance of the sense amplifier) Since $C_A$ can be made considerably small compared with $C_D$, the extremely minute signal voltage on the data line can be amplified to such an extent that it can be sensed by the sense amplifier.

Figure 12:
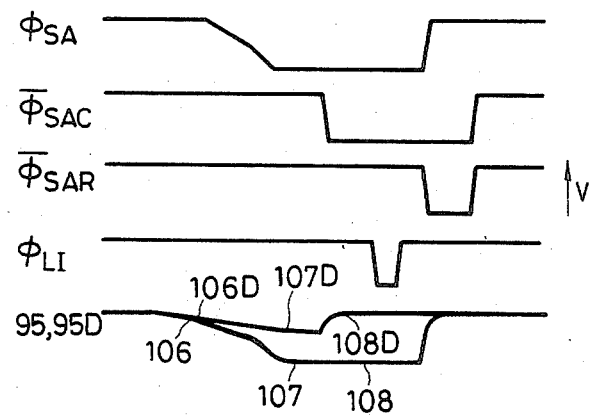
FIG. 12 shows an explanatory view of the operation of the sense amplifier, FIG. 13 which includes FIG. 13 (A) and FIG. 13 (B) shows a circuit diagram illustrating an example of the sense amplifier.

Next, the sense amplifier 100 is described. As shown in FIG. 9, this is composed of a latch circuit in which n-channel MOS transistors 101 are intersectingly coupled, a latch circuit in which p-channel MOS transistor 103 are intersectingly coupled, and a MOS transistor for switching on and off the intermediate portion therebetween. The operation is hereinafter described in accordance with FIG. 12.

The input terminals 95 and 95D are previously set to the power voltage $V_{CC}$. When the above-described BCT amplifier is operated and the signal charges are transferred, the voltage is lowered as shown by 106 and 106D. The difference between 106 and 106D is the signal voltage amplified by the BCT amplifier. Next, the signal for driving the sense amplifier is set to the low level, so that the latch circuit comprising the n-channel MOS transistor 101 may be driven. At this time, it is desirable to gradually trail $\overline{\phi_{SA}}$ at first from the point of improving the sensitivity of the sensing. As a result, the signal voltage between 95 and 95D is amplified as 107 and 107D and the low voltage side (in this case 107) becomed equal to the low level of $\phi_{SA}$. Next $\overline{\phi_{SAC}}$ is set to the low level to make the MOS transistory 102 conductive, so that the latch circuit comprising the p-channel MOS transistor 103 may be operated. As a result, the high voltage side is recovered to the power voltage $V_{CC}$ as 108D. Next, the MOS transistor 121 or 121D (selected by the address signal $a_1$) is made electrically conductive by setting $\overline{\phi_{L1}}$ to the high level and the amplified result is output to the output 125. Finally, $\phi_{SA}$ is set to the high level and $\phi_{SAR}$ to the low level, while 95, 95D, 105 and 105D are set to the power voltage $V_{CC}$ for the next operation.

The feature of this sense amplifier lies in that, since the MOS transistor 102 is in the nonconductive state during the operation of the BCT amplifier, the input capacitance $C_A$ is small. Namely, only the capacitance of the node 95 (95D) contributes to $C_A$ and not the capacitance of 105 (105D). In particular, the $C_A$ can be effectively reduced since the gate capacitance of the MOS transistor 103 does not contribute to $C_A$. As described above, since the amplification factor of the BCT amplifier is inversely proportional to $C_A$, the smallness of $C_A$ means that even the minute signal can be sensed.

Figure 13A:
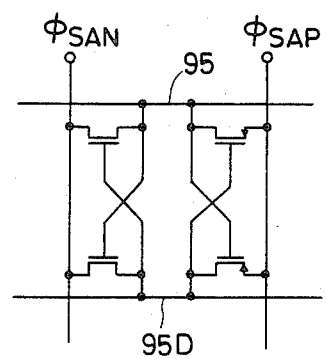
Figure 13B:
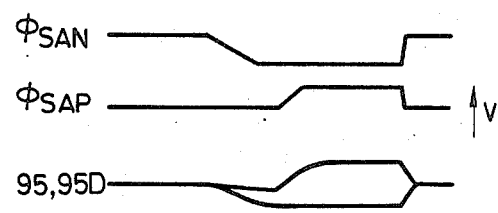

Another feature of this sense amplifier lies in that the source of the p-channel MOS transistor 103 can be connected to the power supply $V_{CC}$. As the sense amplifier, the circuit as shown in FIG. 13 may be used, but in this case, the source of the p-channel MOS transistor becomes the signal $\phi_{SA}$. In contrast, since in the circuit of FIG. 9, this can be used as the power supply, this can be commonly used with the adjacent circuit, e.g. the wiring of the power supply of the reset circuit for sensing 110, as shown in the Figure and the space can be economized.

Figure 14:
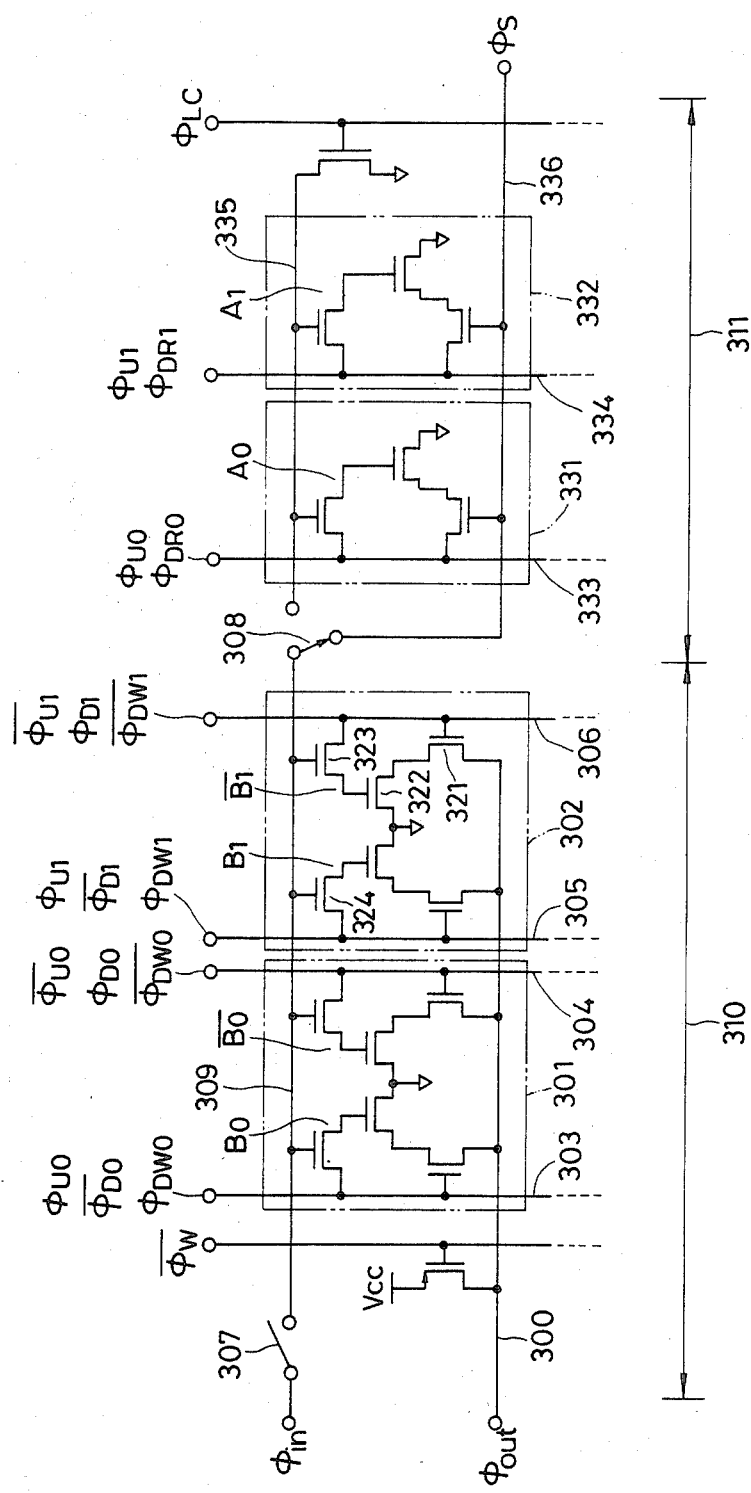
FIG. 14 shows a circuit diagram illustrating an example of the column register, FIGS. 15 and 16 respectively show an explanatory view of each mode of the column registers.

FIG. 14 shows a view illustrating the embodiment of the specific circuit construction of the column register as shown in FIG. 1. As shown in the same Figure, according to this embodiment, the column register comprises two blocks, the write 310 and read 311. Though FIGS. 14, 15 and 16 refer to the case when the number of levels of the multilevel data, if the circuit is enlarged or reduced, the present invention can be similarly applied even when the other number of levels is used.

Figure 15:
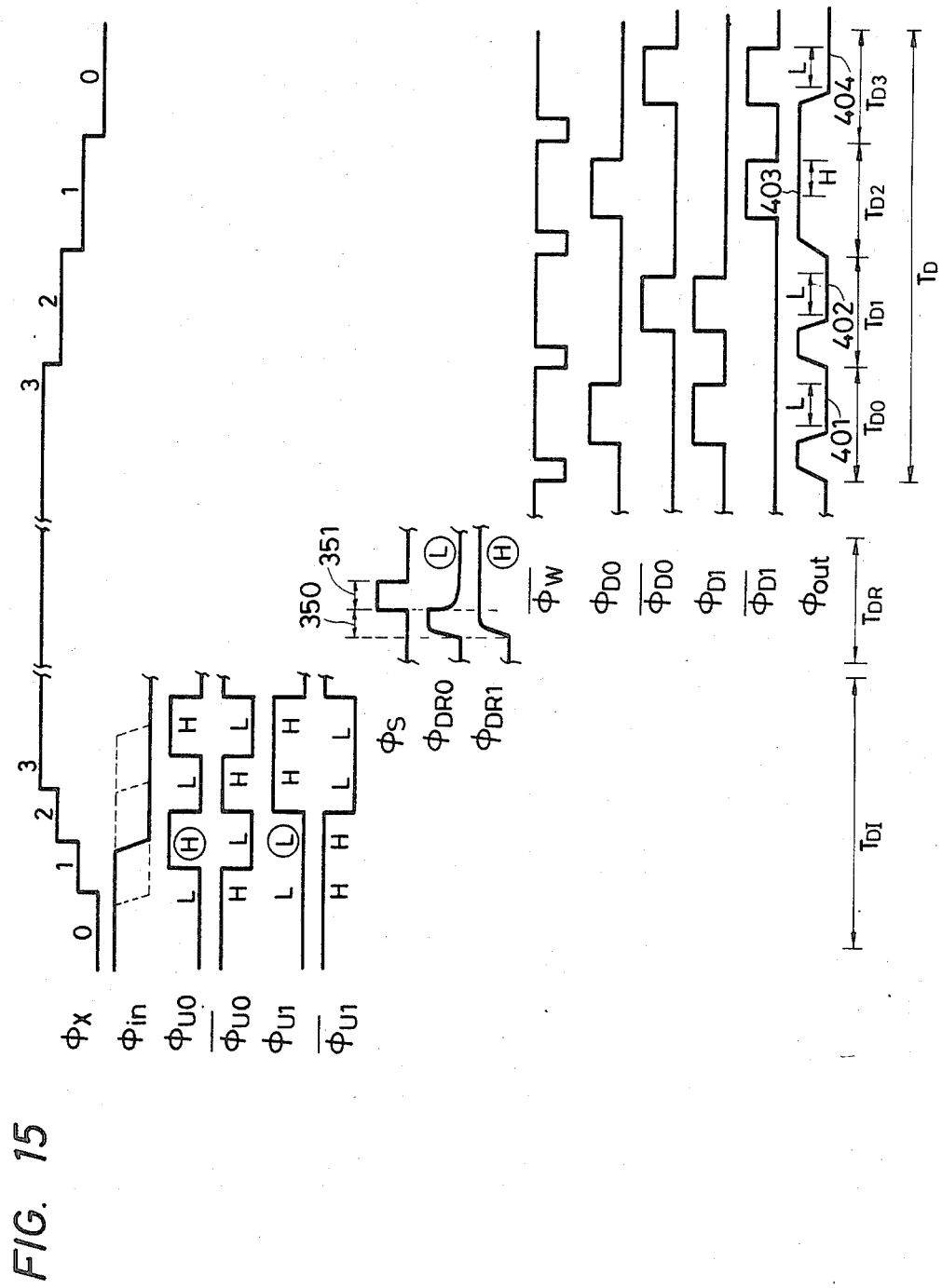
Figure 16:
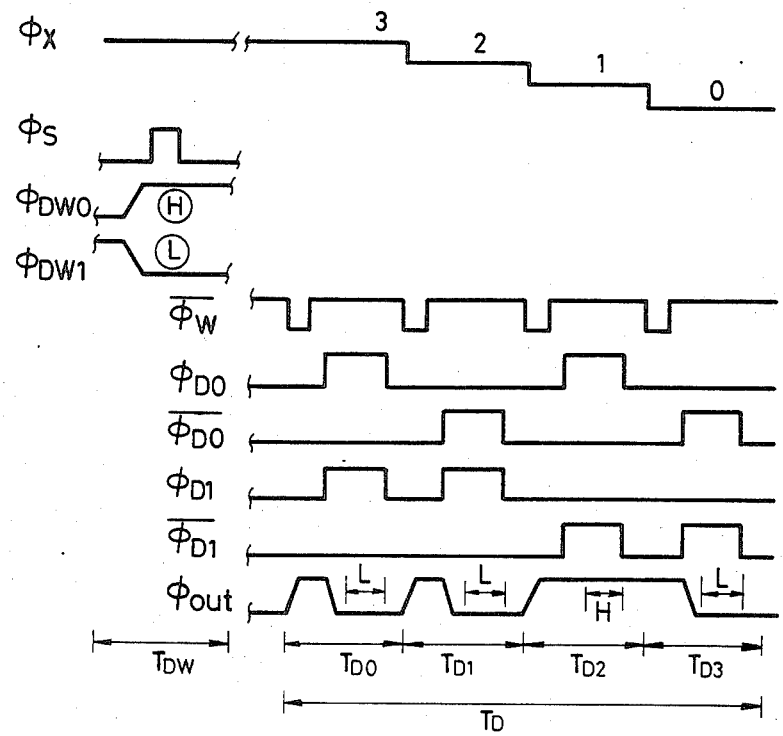

FIG. 15 shows a view, illustrating the mode (period of time $T_{DI}$) in which the data stored within the memory cell is read out to the column register, a mode in which the data is read out from the column register to the exterior of the same register (period of time $T_{DR}$), and a pulse timing of the mode (period of time $T_D$) in which the data of the column register is written into the memory cell. FIG. 16 shows a view, illustrating a mode in which the details written from the exterior to the column register (period of time $T_{DW}$), and a pulse timing of the mode (period of time $T_D$) in which this data is written from the column register to the memory cell.

The present embodiment is described with reference to FIGS. 14 to 16. In FIG. 14, reference numerals 301 and 302 denote memory elements of the writing column register and 331 and 332 memory elements of the reading column register. In this example, 301 and 331 are made to correspond to the lowermost bit information and 302 and 332 to the uppermost one.

To the control line 303 are applied the read control pulse $\phi_{V0}$, the inversed phase pulse $\overline{\phi_{D0}}$ of the write control pulse and the lowermost information pulse $\phi_{DW0}$ of the input data in accordance with each mode. To the control line 304 is applied the pulse having the phase inversed with respect to 303 (High and Low are inversed each other.). Signals $\phi_{V1}$ ($\overline{\phi_{V1}}$), $\overline{\phi_{D1}}$ ($\phi_{D1}$), $\phi_{DW1}$ ($\overline{\phi_{DW1}}$) are also respectively applied to the control line 305 (306). The control pulse $\phi_{V0}$ ($\phi_{V1}$) is applied to the control line 333 (334) and at the time of data output the bit information (inversed) is transmitted as $\phi_{DR0}$ ($\phi_{DR1}$) in accordance with the information from the memory cell. However, ($\phi_{DW0}$, $\phi_{DW1}$) is the pulse transmitting the input data from the exterior of the circuit and ($\overline{\phi_{DR0}}$, $\phi_{DR1}$) the data output to the exterior of the circuit.

Reading of the data stored within the memory cell is conducted within the period of time $T_{DI}$. As shown in FIG. 15, $\phi_{V0}$, $\overline{\phi_{V0}}$, $\phi_{V1}$, $\overline{\phi_{V1}}$ are sequentially varied in the synchronized relation with the stepped wave pulse $\phi_X$ in accordance with the binary code. Meanwhile, the data read out from the memory cell emerges as the output $\phi_{in}$ of the sense amplifier. Since this example relates to the multilevel data "1" (binary code 10 with the least significant digit at the left side), when ($\phi_{V0}$, $\phi_{V1}$)=(H, L), $\phi_{in}$ is varied from High to Low. (However, H=High, L=Low) If the switch 307 had been closed and 308 had been connected to the side 335, (High, Low), (Low, High) and High, Low are each stored within the store nodes ($B_0$, $\bar{B}_0$), ($B_1$, $\bar{B}_1$), $A_0$, $A_1$ of the memory device. This state is hereinafter expressed B=(HL, LH), A=(H, L).

The waveform when the data within the column register is output to the exterior is shown in the period of time $T_{DR}$ (FIG. 15). First, as shown by 350, control lines 333 and 334 are precharged to High. Next, as shown by 351, if the array select pulse $\phi_S$ is set to High, 333 or 334 is discharged in accordance with the data of A. In this example, since A=(H, L), $\phi_{DR0}$=L and $\phi_{DR1}$=High. These are passed through the inverter, so as to be output as the regular binary coded data.

When the data stored within the column register is rewritten into the memory cell, the pulse as shown in the period of time $T_D$ (FIG. 15) is applied. However, the switch 307 is left to be electrically non-conductive and 308 electrically conductive to the side 336. After $\bar{\phi}_W$ is set to Low and the write line 300 is precharged to High, pulses Low, High, Low and High are each applied to the control pulses $\bar{\phi}_{D0}$, $\phi_{D0}$, $\bar{\phi}_{D1}$ and $\phi_{D1}$. This is to be expressed as $\bar{D}$=(LH, HL).

In this example, when these first control pulses are applied, since the store node $B_1$ of the memory element 302 and the control line 306 are High at the same time, the write line 300 is discharged via transistors 321 and 322. Namely, as shown by the reference numeral 401 in FIG. 15, Low is output as $\phi_{out}$ during the period $T_{D0}$.

Thereafter, similarly, control pulses are sequentially applied from the inversed direction so that $\bar{D}$=(HL, LH), (LH, HL) (HL, HL). Since only the third one in which the data B=($B_0\bar{B}_0$, $B_1\bar{B}_1$) coincides with the control pulse data D=($\phi_{D0}$, $\bar{\phi}_{D0}$, $\phi_{D1}$, $\bar{\phi}_{D1}$) has no each element B and D with which "H" coincides, as shown by 403, High is output during the period $T_{D2}$. During the other period, there are ones which coincide with "H" within each element B and D, and via the transistor corresponding thereto the write line 300 is discharged and Low is output as $\phi_{out}$. (401, 402, 404)

In this case, $\phi_{D0}$ and $\phi_{D1}$ are synchronized with the stepped wave pulse $\phi_X$ which is applied to the memory array and when High emerges at $\phi_{out}$, the write gate is driven and the multilevel data ("1" in the above example corresponding to the data (bit data) which was written into the memory is accumulated into the memory cell.

When the data is written from the exterior, steps are followed as shown in FIG. 16. However, the switch 307 is left to be electrically nonconductive and 308 connected to the side 336. The input data is sent as $\phi_{DW0}$ and $\phi_{DW1}$ during the period $T_{DW}$. The array selection pulse $\phi_S$ is set to High and data $\phi_{DW0}$, $\bar{\phi}_{DW0}$, $\phi_{DW1}$ and $\bar{\phi}_{DW1}$ are taken into the memory cell. In this example, since ($\phi_{DW0}$, $\phi_{DW1}$)=(H, L), B=(HL, LH) is stored. The process in which this data B is written into the memory cell by the detection of the coincidence with the control pulses $\phi_{D0}$, $\phi_{D1}$ is the same as in the above-described rewritting. (period $T_D$)

The column register shown in FIG. 14 has the following feature. Namely, when the multilevel data was M=$2^N$ is proportional not to M, but to N, and even when the number of the multiple levels are numerous, the area which the column register occupies does not become so large, which is suitable for the high integration of the circuit through the multiple values storing system. Besides, since the write block 310 is a decoder for decoding from the binary code into the multiple data and the read block 311 an encoder for encoding from the multiple values data to the binary code, data can be decoded and encoded within each array without the need for providing a multiplicity of wirings corresponding to the multiple values onto the column register, which is also suited to the requirement for the high integration of the circuit.

Furthermore, as shown in this embodiment, the high speed and continuous reading in the direction of the array is possible, because the binary coded data can be output only by writing the column register and dividing it into two read blocks, so that reading of the data into the exterior may be selected by the array address pulse $\phi_S$.

Furthermore, in the write block, a pair of the bit data such as ($B_0$, $B_0$) ($B_1$, $B_1$) are stored within a single memory element $\phi$ and a pair of control pulses such as ($\bar{\phi}_{D0}$, $\phi_{D0}$) or ($\bar{\phi}_{D1}$, $\phi_{D1}$) are also applied, so that decoding of the write binary code and the detection of the coincidence (of B with D) which is necessary for rewriting of the data read out from the memory cell may be similtaneously achieved. Namely, as usual, complicated circuits in which the Exclusive-OR is used are necessary for the circuit for detecting the coincidence, but in the above-described embodiment, the memory device can be realized by six transistors including the switching gate to the store node (transfer gate: for example, 323 and 324 in FIG. 7) and the area of the column register can be effectively reduced.

In this case, in the above-described embodiment, even if the store nodes $B_0$ $B_0$, $B_1$ $B_1$ (including $A_0$ and $A_1$) do not comprise the gate and the source (or drain) of such transistor, other memory cells, for example, flip-flop memory cell may be used. However, in the above-described embodiment, the simple structure shown in the embodiment is most advantageous in raising the degree of the integration.

Furthermore, though in the above-described embodiment the digital data which is sent to and from the exterior is chosen as the binary code and the application of control pulses $\phi_{D0}$, $\phi_{D1}$, $\phi_{V0}$ and $\phi_{V1}$ obeyed the order of the binary code or its inversed order, this is not restricted thereto, but any code comprising two digits 0 and 1, for example Gray code may be used. If the Gray code is used, even when the multilevel data caused the one level (value: 1) error within the memory cell, since it is only the one bit error, it is easy to correct the error in the peripheral circuit. Furthermore, since the order of the application of the control pulse is formed as (LLHH)(LHHL) in which H and H are respectively grouped as one, the number of the charges and the discharges of the control line is decreased in the pulse such as $\phi_{V0}$ and $\phi_{V1}$ and the power consumption can be reduced.

Figure 17:
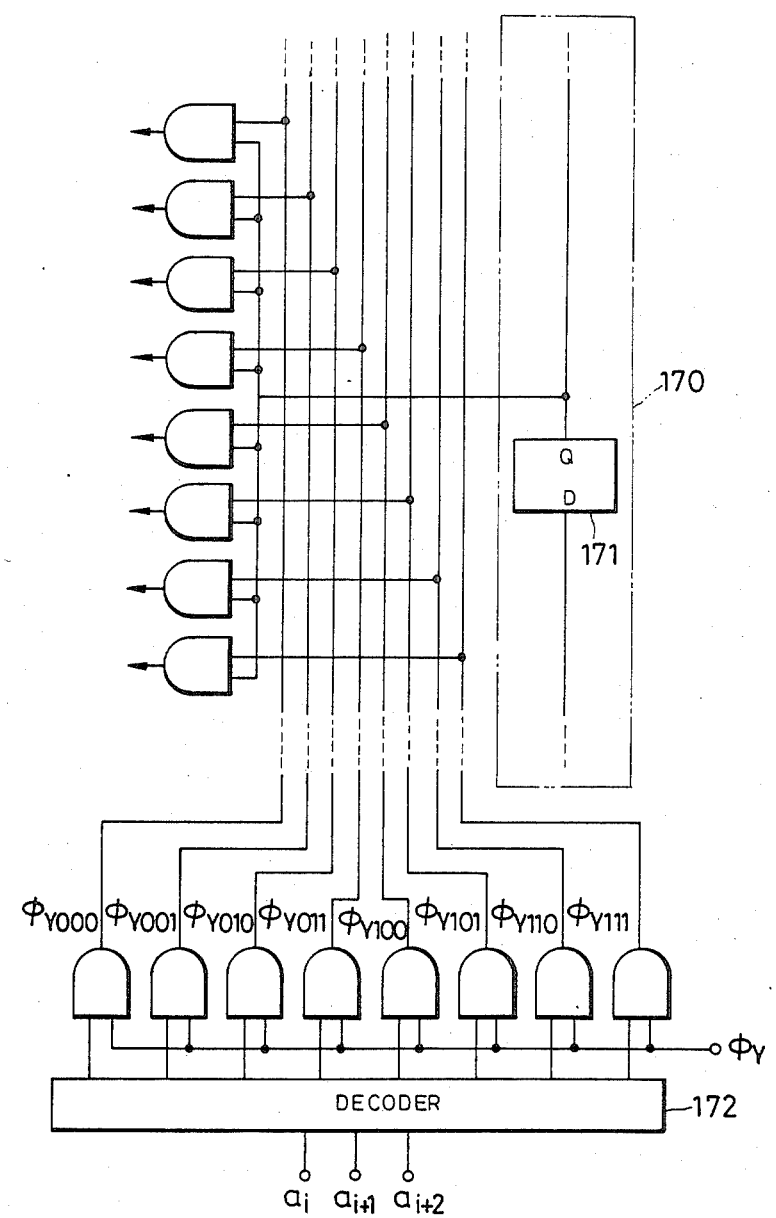
FIG. 17 shows an explanatory view illustrating the circuit for selecting the data line.

The data line select circuit 6, as shown in FIG. 17, is a system in which the data line is serially selected by using the shift register. It is needless to say that, in place of the shift register, the decoder can be provided, so that they can be selected at random, but since the access time is long in this memory, it is more practical to confine the random access only to each block and to assign the serial access to the interior of the block. However, the shift register selects eight data lines as a unit and one of them can be selected at random by address signals $a_i$, $a_{i+1}$, $a_{i+2}$. Therefore, signals $\phi_{Y000}$ to $\phi_{Y111}$ obtained by predecoding the data line select signal $\phi_Y$ by $a_i$, $a_{i+1}$, $a_{i+2}$ are formed (decoder 172) and the logical product between these signals and the output of the shift register is formed for using it as the selection signal of the data line. Consequently, the number of the D flip-flops 171 included by the shift register is M/8.

According to this method, since the interval at which the D flip-flops are disposed amounts to eight times as large as that used in the method in which the serial access is wholly caused, the design of the layout is advantageously facilitated. Furthermore, in the error correction circuit to be described later, since a series of memory cells which are serially accessed are used as a single correction block, memory cells which belong to the same block, which are separate by eight data lines or more between each other, the probability of the occurrence of the simultaneous errors is small.

Figure 18:
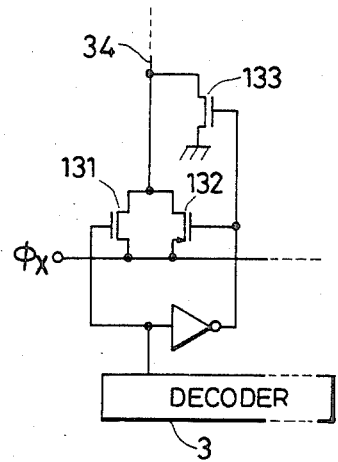
FIG. 18 shows a circuit diagram illustrating a word driver.

The decoder 3 for selecting the word line may be the same as used in the conventional memory. The word driver 2 may be the same circuit as use in the conventional memories, but the circuit as shown in FIG. 18 may be used. The feature of this circuit consists in the fact that the parallel connection of the n-channel MOS transistor 131 and the p-channel CMOS transistor 132 is used as the driving MOS transistor. As described above, since the stepped wave pulses are applied to the word line, it is desirable to set the current driving capacity approximately constant even when the voltage is high or low. If the above described construction is used, the current driving capacity can be set approximately constant by adjusting the constant of the both MOS transistors.

Figure 19:
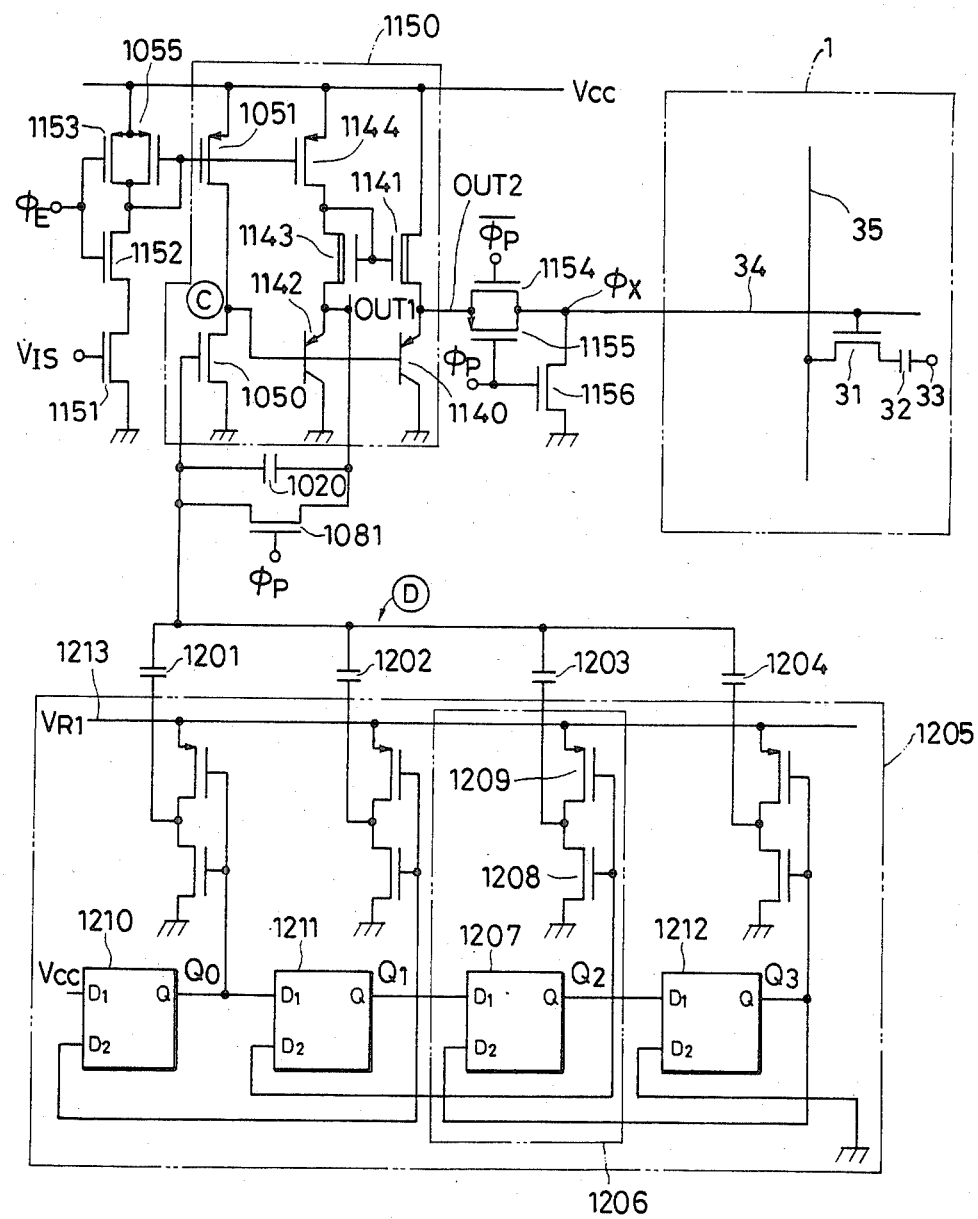
FIG. 19 shows a circuit diagram illustrating a stepped wave generator.

FIG. 19 shows an embodiment of the stepped wave generator 17 of the semiconductor multilevel data storing device. In the same Figure, reference numeral 1 is a memory array, 1150 an inverter, 1055 and 1151 to 1153 bias circuits of the load transistor of the inverter, 1154 and 1155 switching circuits for switching the voltage of the word line into the analog signal output and grounding potential, 1081 a MIS switch for initializing the operating point of the inverter, 1020 a feedback capacity, 1201 to 1204 driving capacities and 1205 a driving circuit of the capacity.

In FIG. 19, 1050 and 1051 constitute the inverter in which the constant current is loaded. The output circuit (driver) composed of the transistors 1140 to 1144 is connected to the drain (point C) of the transistor 1050 and the output of that buffer (OUT 2) is used as the output of the inverter. The output stage of the push-pull amplifier is biased by transistors 1140 to 1141 and the output stage by 1142 to 1144, so that the current may constantly flow, and the output is prevented from attaining the high impedance due to the simultaneous conduction of the transistors 1140 to 1144 of the output stages. Namely, the AB class push-pull driver is formed by 1140 to 1144.

In this example, to widen the amplitude of the output of the circuit, a portion of the MIS transistor is realized by the N-channel MIS transistors 1141, 1143 and the PNP type bipolar transistors 1140 and 1142 which are low in the threshold voltage. The input voltage $V_{IN}$ which makes the output voltage of the inverter from $V_{CC}$ to 0 V attains the value adjacent the threshold voltage $V_{TH}$ of the driving MIS transistor. In order to obtain this value, at the time of initialization, the input Ⓓ of the inverter and the output 2 are short-circuited by closing the switch 1081. Thereafter, at the time of the operation, the switch 1081 is made non-conductive and the feedback capacitance 1020 is connected between the input and the output of the inverter and a plurality of the driving capacitances 1201 to 1204 are connected to the input. Since the voltage gain of the inverter is sufficiently highly set, the input voltage is not practically varied even when the output voltage is varied and the point D can be regarded as the hypothetical grounding point. Consequently, the output voltage $V_{OUT}$ can be expressed as follows.

$$V_{OUT} = \frac{C_I}{C_F} (Q_0 + Q_1 + Q_2 + Q_3) \times V_{RI} + V_{TH}$$

where:
$C_I$: value of the driving capacitances 1201 to 1204
$C_F$ value of the feedback capacitance 1020
$Q_0$ to $Q_3$ value indicating the state of the output of the shift registers 210 to 212 (0 or 1).

As a result, from the states of $Q_0$ to $Q_3$, the analog signal voltage corresponding thereto can be obtained to the output.

Figure 20:
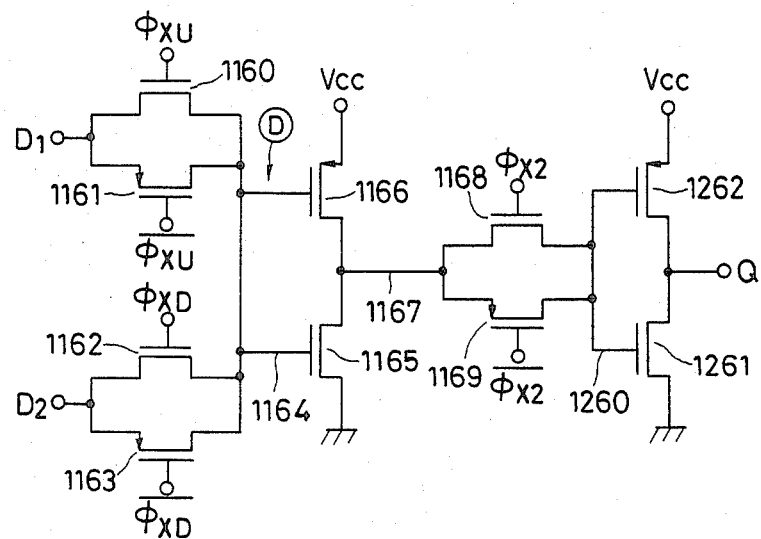
FIG. 20 shows a circuit diagram illustrating a bidirectional shift director.

FIG. 19 shows a circuit for giving the five level stepped wave and applicable to the memory storing the data of the value 5. In FIG. 19, reference numeral 31 corresponds to one of the memory cell transistors and 34 to the word line selected by 34. When the precharge pulse is $V_{CC}$, the word line is made to fall to the grounding potential through the transistor 1156 and when $\phi_P$ is 0 V, i.e. in the operating state, it is connected to the output OUT2 of the driver. One end of the feedback capacitance 1920 is connected to the other output terminal OUT1 of the driver. Such division of the load into the driving output terminal and the feedback output terminal is conceived to prevent the overshoot of the output voltage which can cause the problem when the large load capacitance is driven. In the bias circuit which is constituted by 1055, 1151 to 1153, 1151 and 1055 are intended for imparting the bias to the constant current load and 1152 and 1153 is a switch provided for avoiding the unnecessary consumption of the electric power when the analog signal output circuit is not in the operating state ($\phi_E$ is 0 V). One end of the driving capacitance is commonly connected to the input of the inverter and the other is driven by the output of the C-MIS (Complementary MIS). In order to obtain the stable analog output signal voltage even when the power voltage $V_{CC}$ is fluctuated, it is so designed that the stabilized voltage $V_{RI}$ is given to the power supply of the C-MIS inverter by the voltage regulator 16 which is independent of $V_{CC}$. Though capacitances 1201 to 1204 are so designed as to have the same values, it can be conceived that values of the devices are distributed due to the manufacturing conditions or the like. Since, in the multilevel memory, the absence of the difference between the write and read voltage levels (1 and 9, and 2 and 8, and 3 and 7, and 4 and 6) is desired, in this case, the C-MIS inverter is driven by the bidirectional shift registers 1210 to 1212. An example of the construction of the circuit of the bidirectional shift register is shown in FIG. 20. The rising input D₁ is connected to the input Ⓓ of the first stage C-MSI inverter (1165, 1166) via the MIS switches 1160 and 1161 which are switched by the rising driving pulses $\phi_{XU}$ and $\overline{\phi_{XU}}$. Similarly, the descending input D₂ is connected to Ⓓ via MIS switches 1162 and 1163 which are switched by the descending driving pulses $\phi_{XD}$ and $\overline{\phi_{XD}}$. Furthermore, MIS switches 1168 and 1169 are connected between the output of the first step C-MIS inverter and the second step C-MIS inverter.

Four bidirectional shift registers 1207, 1210 to 1212 are connected as shown in FIG. 19. As a result, at the rising time the voltage transits from 0 V to $V_{RI}$ in the order of $Q_0$ to $Q_3$. Furthermore, at the descending time, in contrast, the voltage transits from $V_{RI}$ to 0 V in the order of $Q_3$ to $Q_0$. As described above, by inverting the direction of the shift at the rising and the descending time, even if there is a distribution between the driving capacitances, voltages at the time of reading and the writing can be made to coincide with each other.

In the example, instead of driving the driving capacitance by the digital signal, it is driven by the output of the shift register. This is for preventing the notch of the output which can occur when it is driven by the digital signal. By the notch is meant the transitional occurrence of the output voltage which exceeds the range of the analog signal voltage around the original value when the divergence of the timing of the change between each digit when the content of the digital signal is switched.

FIG. 21 shows the driving pulse and the voltage at the point D in this embodiment and the waveform of the analog signal output $\phi_X$ which is observed on the word line 34. At the timing $t_{30}$, the pulse is set from 0 V to $V_{CC}$, so that the analog signal generator may be set to the initialized state. At this time, since the pulse $\phi_E$ is held to the $V_{CC}$ level, the MIS switch 1081 is in the electrically conductive state and OUT 1, OUT 2 and the voltage at the point D are elevated up to the threshold voltage $V_{th}$ (1170). Then at the timing $t_{31}$ the pulse $\phi_P$ is set to 0 V and the MIS switch 1081 is closed for the operation. Simultaneously, the voltage $V_{TH}$ is output to the word line (1). The voltage $V_{TH}$ of the memory cell transistor 31 and the voltage $V_{TH}$ of the driving transistor 1050 of the inverter in the analog signal generator are made to be approximately equal to each other (for that purpose transistors having the same width and length of the channel as 31 are parallelly connected to each other in the necessary number), so that the first step of the word line required when the signals read out from the memory cell may be automatically obtained. Subsequently, if the pulse $\phi_{XU}$ and the pulse $\phi_{X2}$ are applied four times, the driving pulse which transits from 0 V to $V_{RI}$ occurrs to $Q_0$ to $Q_3$ in the synchronized relation with the rise of the pulse $\phi_{X2}$ (for example, time $t_{32}$) As a result, rising stepped wave pulses having four stages (2 to 5) are obtained as the output $\phi_X$. Likewise, when data is written into the memory cell, the pulse $\phi_{XD}$ and the pulse $\phi_{X2}$ are alternately applied by four times, and the driving pulse which transits from $V_{RI}$ to 0 V occurs to $Q_3$ to $Q_0$ in the synchronized relation with the rise of the pulse $\phi_{X2}$ (for example, time $t_{34}$), as q result of which descending stepped wave pulses having four stages (6 to 9) can be obtained as the output $\phi_X$.

Though relatively simply constructed, since the amplifying stage is only an inverter, in this circuit the phase margin of the feedback circuit is large and since as the output stage the AB class push-pull driver is used, no overshoot is seen and the settling is achieved at a high speed. Furthermore, since the capacitance is used for the occurrence of the analogue voltage, the power consumption is low compared with the D/A converter in which the resistance string is used, and since the area occupied by the chip is small, the A/D converters are integrated on a single chip, so that the compact system can be effectively constructed.

Next, the correcting function of this memory is described. This memory has the correcting function through which the soft errors are corrected by the error correcting codes (hereinafter abbreviated as ECC). The multiple shortened cyclic codes are used as ECC. This has the following feature.

(1) Since the q value ($\log_2 q$ bit) data is accumulated to a single memory cell, the data of $\log_2 q$ bit is likely to the simultaneous error. Against this possibility, though the multiple correcting code (for example, if q=8, a triple error correction code is used) can be used as ECC, it is desirable to treat the $\log_2 q$ as a single symbol by using the multiple (q-dimensional) code, since the number of the memory cells may be small for the check bits.

(2) Encoding and decoding are serially conducted by using the feedback shift register circuit utilizing the nature of the cyclic codes. As a result, the dimension of the encoder and the decoder can be made smaller.

Namely, if the multidimensional shortened cyclic code is used, the increase of the area due to the introduction of the error correcting function can be made extremely small and the highly reliable semiconductor memory can be made without impairing the high degree of integration.

Next, one example of ECC is shown. This relates to the example in which q=16 and the number of data points k=128 (i.e. number of data bits is $4 \times 128 = 512$). First, the hexadimensional cyclic code having the following generation polynomial is conceived. ($\gamma$ is an original element of the finite field (16) having the order of 16, $\gamma^4 + \gamma + 1 = 0$)

$$G(x) = (x+1)(x^2 + x + \gamma^{14}) = x^3 + \gamma^3 x + \gamma^{14}$$

In this code, the length of the code is 255 and the number of data points 252 and the number of check points 3, but by shortening it, it is assumed that the length of the code n is 131, number of the data points k=128 and the number of check points m=3.

Figure 22:
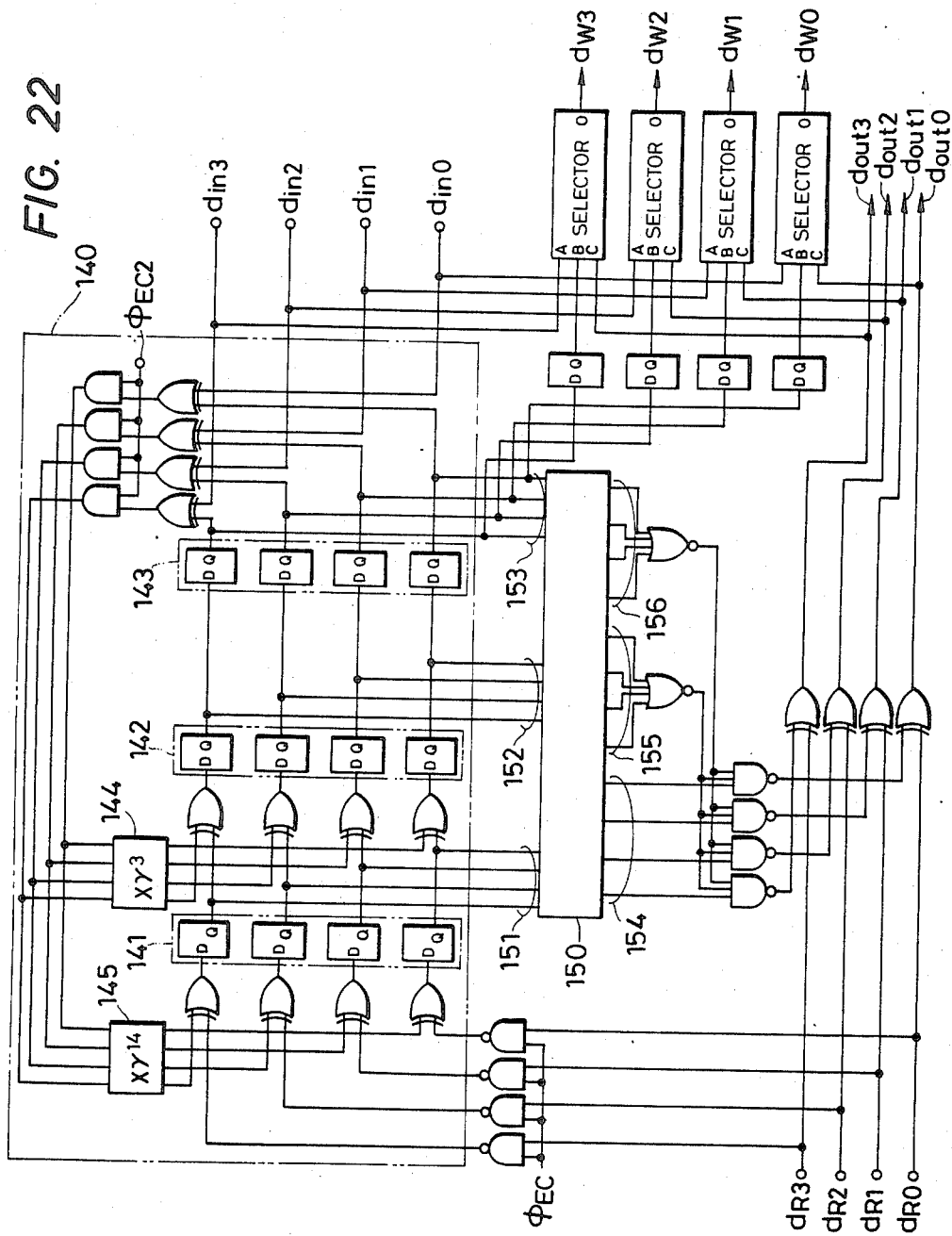
FIG. 22 shows a circuit diagram illustrating the encoder and decoder, FIG. 23 which includes FIG. 23 (A) and FIG. 23 (B) shows a timing chart of the operation of the memory of the embodiment according to the present invention.

The encoder/decoder 21 is shown in FIG. 22. In the same figure, reference numeral 140 is a feedback shift register circuit in which hexadecimal symbols are stored one by one by four flip-flops (141, 142, 143) 144 and 145 each represent a multiplier circuit (multiplier $\gamma^3$ and $\gamma^{14}$) which outputs the symbol obtained by multiplying the input symbol by multiplying $\gamma^3$ or $\gamma^{14}$. Terminals $d_{in0}$ to $d_{in3}$ are each connected to the input buffer 23, $d_{out0}$ to $d_{out3}$ to the output buffer 23 and $d_{R0}$ to $d_{R3}$ and $d_{W0}$ to $d_{W3}$ to the column register 5. Symbols stored anew into 141, 142, and 143 when the shift pulse is applied in the state in which symbols $C_0$, $C_1$ and $C_2$ are stored within 141, 142 and 143 are taken respectively anew as $C_0'$, $C_1'$ and $C_2'$. If $\phi_{EC1}$ is the logic 0 and $\phi_{EC2}$ the logic 1, the following relationship is met.

$$C_2'x^2 + C_1'x + C_0' = x\{(C_2 + d_{in})x^2 + C_1 x + C_0\} \quad (mod\ G(x))$$

If $\phi_{EC1}$ is the logic 1, the following relationship is met.

$$C_2'x^2 + C_1'x + C_0' = x\{(C_2 + d_{in})x^2 + C_1 x + C_0\} + d_R (mode\ G(x))$$

where: $d_{in}$ and $d_R$ are each hexadimensional symbols which are input from $d_{in0}$ to $d_{in3}$ and $d_{R0}$ to $d_{R3}$. If $\phi_{EC2}$ is the logic 0, the above-described operation is not conducted but only shifted.

150 is a multiplier circuit (multiplier circuit $x^{124}$). Namely, if the hexadimensional symbols incoming from input terminals 151, 152 and 153 are respectively assumed to be $C_0$, $C_1$ and $C_2$, and those outgoing from output terminals 154, 155 and 156 $P_0$, $P_1$ and $P_2$, the following relationship is met.

$$P_2x^2+P_1x+P_0=x^{124}(C_2x^2+C_1x+C_0) \quad (mod\ G(x))$$

Next, the operation of this circuit is described. At the time of writing, first, the control signal $\phi_{EC1}$ is set to the logic 0, $\phi_{EC2}$ to the logic 1 and the selector is set to the state in which the terminal A is selected, so that the feedback shift register circuit may be shifted 128 times, feeding input data $a_{130}, a_{129}, \ldots a_3$ from $d_{in0}$ to $d_{in3}$. (At this time, the input data is output as they are to $d_{W0}$ to $d_{W3}$.) At this time generated check bits $a_0$, $a_1$ and $a_2$ are stored within 141, 142 and 143. These bits are coefficients of the residue $R(x)=a_2x^2+a_1x+a_0$ obtained by dividing $$A(x)=a_{130}x^{130}+a_{129}x^{129}+\ldots +a_3x^3$$

by G (x). Next, and $\phi_{EC1}$ and $\phi_{EC2}$ are set to the logic 0 together and the selector is set to the state in which the terminal B is selected and shifted three times, so that $a_2$, $a_1$ and $a_0$ may be sequentially taken out.

At the time of reading of data the syndrome is first calculated. For that purpose, $\phi_{EC1}$ and $\phi_{EC2}$ are set to the logic 1 together and the feedback shift register circuit is shifted 131 times, inputting from $d_{R0}$ to $d_{R3}$ data which were read out $b_{130}, b_{129}, \ldots b_0$ (including the check bits).

At this time, generated syndromes $S_0$, $S_1$ and $S_2$ are stored respectively in 141, 142 and 143. These syndromes are coefficients of the residue $S(x)=S_2x^2+S_1x+S_0$ obtained by dividing $$B(x)=b_{130}x^{130}+b_{129}x^{129}+\ldots +b_1x+b_0$$

by G (x). If no error is detected, S (x)=0, but in case the error e is detected to $b_i$.

Next, $\phi_{EC1}$ is set to the logic 0, $\phi_{EC2}$ to the logic 1 and the selector to the state in which the terminal C is selected. By so doing, $b_{130}, b_{129}, \ldots b_0$ are input from $d_{R0}$ to $d_{R3}$ and the feedback shift register circuit is shifted 131 times. The content of the shift register beocmes $$S(x)\cdot x^{131-i}=e\cdot x^{131} \quad (mod\ G(x))$$

at the (131−i)th time and the output of the multiplier circuit 150 (multiplier $x_{124}$) becomes $$e\cdot x^{131}\cdot x^{124}=e\cdot x^{255}=e \quad (mod\ G(x)).$$

As a result, coefficients of x and $x^2$ (155 and 156) become zero and the term of the constant (154) becomes equal to the error pattern e. Consequently, by detecting that 155 and 156 have become zero, the read data is corrected at that time by using 154. Reference numeral 160 in the figure is the correction circuit.

By providing the multiplier circuit 150 (multiplier $x^{124}$) in this circuit, following advantages are obtained. If, without providing 150, inputs 151, 152 and 153 are directly connected to the outputs 154, 155, 156, the feedback shift register circuit must be previously shifted 124 times during the generation and the correction of the syndrome. Namely, by multiplying the syndrome by $x^{124}$, $$S(x)\cdot x^{124}=e\cdot x^i\cdot x^{124}=e\cdot x^{124+i} \quad (mod\ G(x))$$

is previously sought and only when, after that the shift register circuit is shifted (131−i) times, $$e\cdot x^{124+i}\cdot x^{131-i}=e\cdot x^{255}=e \quad (mod\ G(x))$$

Consequently, the number of the shifts becomes necessary by 124 times. (This is because the cyclic code having the length 255 is shortened by 124 points.) If the multiplier circuit (multiplier $x^{124}$) is provided, such need can be eliminated, as a result of which, time required for the correction can be shortened.

Next, the fault tolerant circuit 22 is described. This circuit substitutes the defective data line by the replacement data line. Since, as described above, the data line is serially selected, the conventional fault tolerant method which is based on the random access principle cannot be applied, but the method as suggested in the European patent application Publication No. 84116060.9 may be used. Furthermore, though not used in this embodiment, the word line fault tolerant circuit may be provided. (Since the word line can be accessed at random, the conventional method can be applied.) Since the increase of the area caused by the provision of the fault tolerant circuit can be made extremely small, the high degree of integration is not impaired, but the yield can be improved, while the cost can be reduced.

Figure 23A:
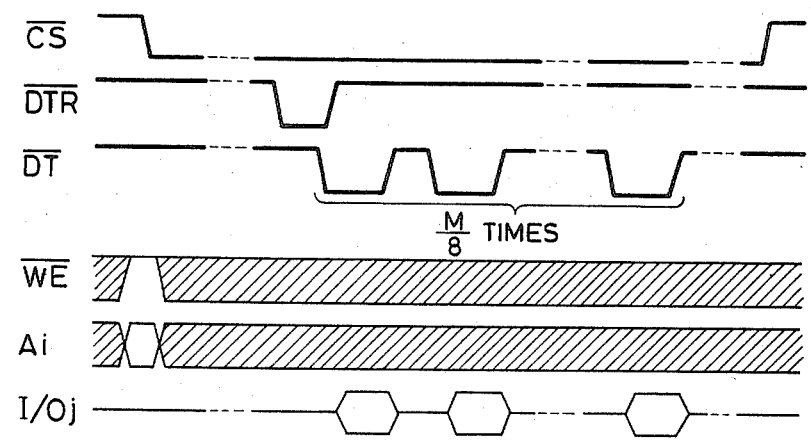
Figure 23B:
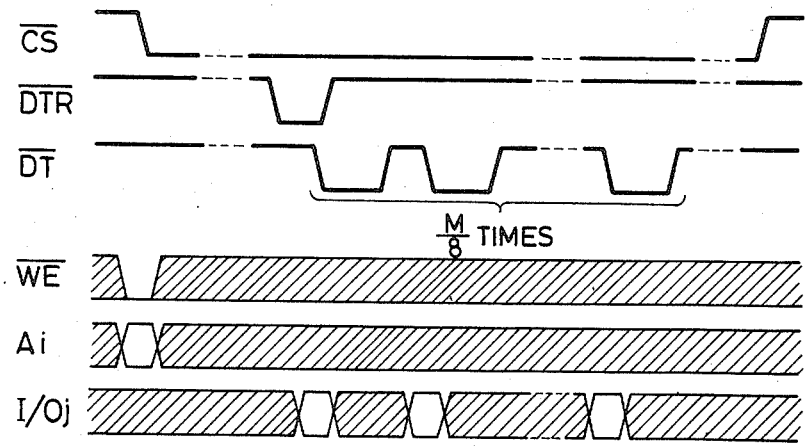

Next, the operation timing of this memory is described in accordance with FIG. 23. This memory is controlled by the chip select signal $\overline{CS}$ and the data transfer signal $\overline{DT}$. Furthermore, it has terminals which issue the data transfer request signal $\overline{DTR}$ for requesting the application of $\overline{DT}$.

This memory takes in the address signal $A_i$ and the write enable signal $\overline{WE}$ by the rise of $\overline{CS}$. Next, when the preparation of reading or writing has completed, the signal $\overline{DTR}$ is trailed. $\overline{DTR}$ is returned to the high level when $\overline{DT}$ is applied. Reading (FIG. 23, (A)) and writing (FIG. 23, (B)) are conducted in synchronized relation with the application of $\overline{DT}$. As described above, each time $\overline{DT}$ is applied, data is read out or written by each 2 $\log_2 q$ and further, since the number of the application of $\overline{DT}$ is M/8 times, data constituted by M/2 $\log_2 q$ in all are serially read out and written.

In this case, the advantage obtained by issuing the data transfer request signal $\overline{DTR}$ is as follows. Until the multilevel data is read out from the memory cell and is stored into the column register, as described above, the stepped wave pulse must be sequentially elevated and the sense circuit must be driven each time and further, since the BCT amplifier is used in the sense circuit, it takes much time. Furthermore, though the generation of the syndrome is necessary for correcting the error at the time of reading, it is not necessary at the time of writing. Therefore, time required until the application of $\overline{DT}$ becomes possible differs between the time of reading and that of writing. Furthermore, when, at the time of application of $\overline{CS}$, the refresh cycle to be described later is being performed, the application of $\overline{DT}$ must be stood by until the completion of that cycle. In this way, since the time required until, after $\overline{CS}$ has been applied, $\overline{DT}$ becomes applicable is long and yet is not constant, the memory will be not user-friendly without $\overline{DTR}$. In the presence of $\overline{DTR}$, users may detect that $\overline{DTR}$ has been issued and may apply $\overline{DT}$ M/8 times without paying a special attention to the fact that the time is not constant.

Next, timing pulse generators for realizing the above-described timing is described.

Figure 24:
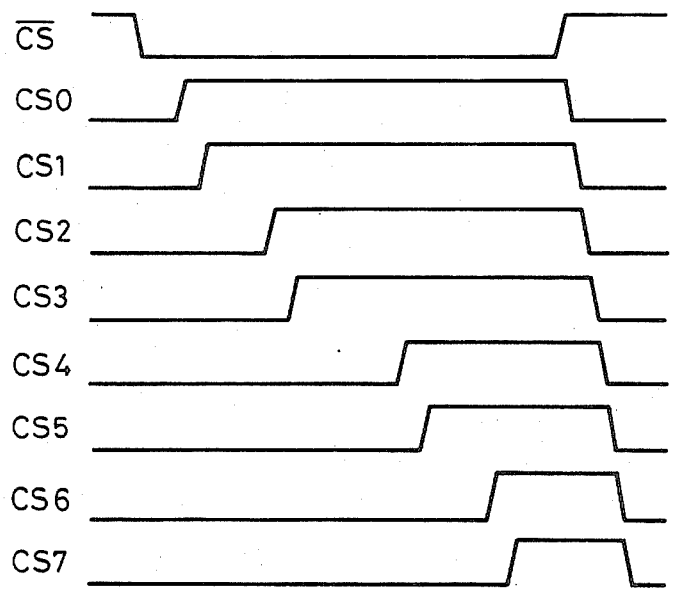
FIG. 24 shows a view illustrating the operation of the timing generator.

This memory has four timing pulse generators 12, 13, 14, and 15. Reference numeral 12 generates the timing signal necessary for reading the multilevel data from the memory cell, 13 the timing signal necessary for transferring the data by $\overline{DT}$ and for correcting the error, 14 the timing signal necessary for writing the multilevel data into the memory cell. 15 controls 12 to 14 as a whole. The operation is hereinafter described in accordance with FIG. 24.

When $\overline{CS}$ is applied, the fourth timing generator 15 generates signals $\phi_{AB1}$ and $\phi_{AB2}$ for driving the address buffer 10 and WE buffer 11. Next, it is decided whether the refresh cycle is being executed now and if not (RFSH is on the low level), the signal CS0 is immediately generated and if yes (RFSH is on the high level), after the completion of the cycle, the signal CS0 is generated, so that the initializing of each circuit such as of the charge transfer type amplifier (FIG. 10, (B-1)) may be conducted. After the completion of the initializing, the signal CS1 is generated and the first timing pulse generator 12 is driven.

Figure 25:
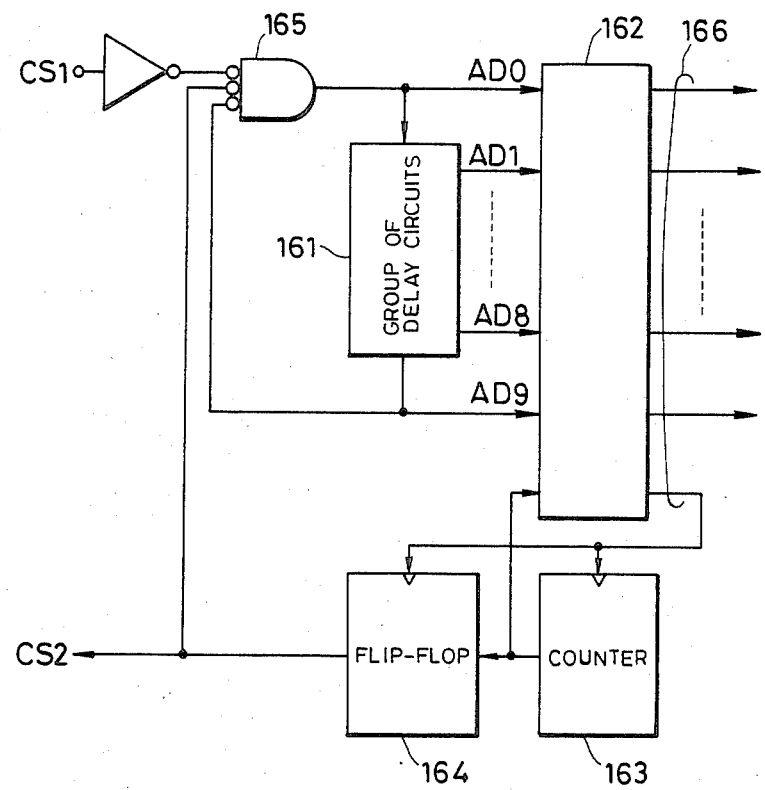
FIG. 25 shows a view illustrating a first timing generator according to the present invention.

The first timing pulse generator 12 is a circuit for generating the timing signal for driving the stepped wave voltage generator 17, sense circuit 4, column register to read out the multilevel data from the memory cell and store it into the column register 5. The construction of the circuit is shown in FIG. 25. In the same figure, 161 is a group of the delay circuits, 162 a combinational logical circuit, 163 a counter, 164 a flip-flop. When the driving signal CS1 is set to the high level, the group of delay circuits 161 and the NOR gate 165 start to oscillate as the ring oscillator. The group of the delay circuits 161 creates signals AD1 to AD9 which have delayed by the proper time from the input signal AD0. The combinational logical circuit 162 creates the necessary timing signal 166 from these signals. The counter 163 is driven at one of these timing signals to count the number of times by which signals are generated. When the output of the counter has attained q (or q−1), the flip-flop is set and the signal CS2 rises. The CS2 stops the oscillation and informs the fourth timing pulse 15 of the completion of the operation.

The feature of the timing pulse generator lies in that, since the timing of the signal can be set individually by the group of the delay circuits 161 and the format by the combinational logical circuit 162, a variety of timing signals can be generated compared with the circuit of the inverter array. Furthermore, the generation of the signal can be easily controlled in accordance with the value of the counter. (for example, it can be so designed that, at the first time, the specific signal is not issued.)

Figure 26:
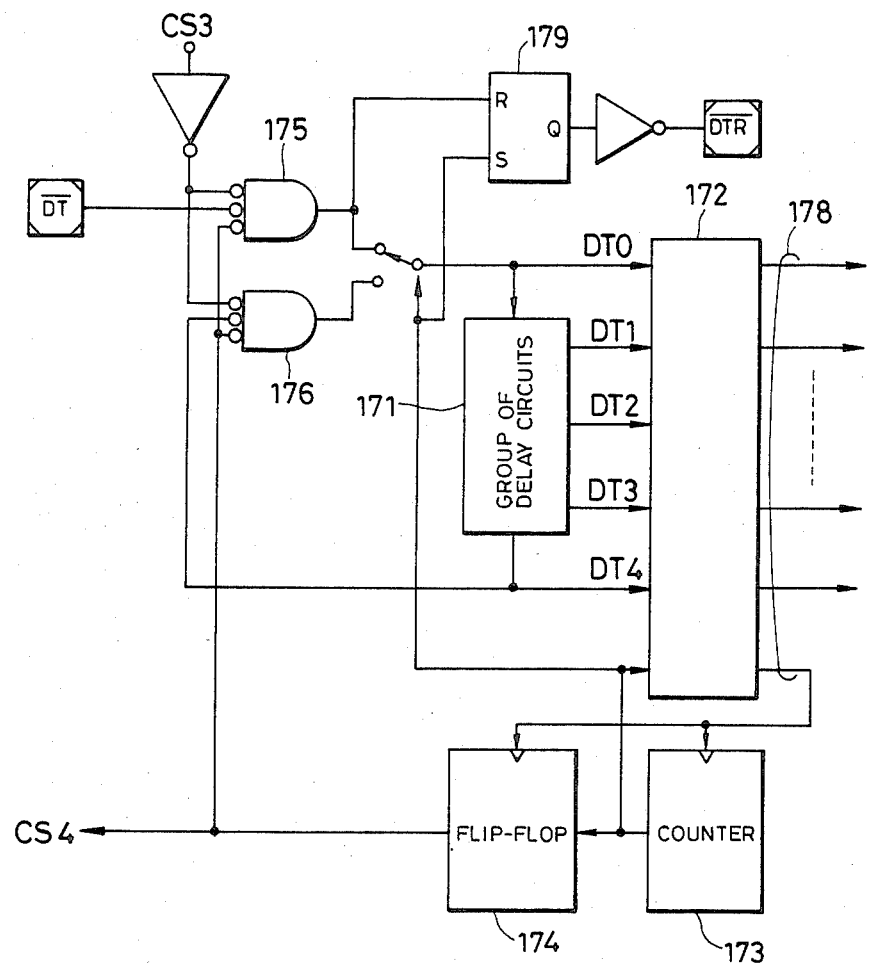
FIG. 26 shows a circuit diagram illustrating a fourth timing generator.

Next, the fourth timing pulse generator 15 issues the signal CS3 and drives the second timing pulse generator 13. The second timing pulse generator 134 generates the timing signal for driving the data line select circuit 6, encoding/decoding circuit 21, fault tolerant circuit 22, input buffer 23 and the output buffer 24. The construction of the circuit is shown in FIG. 26. This is practically the same as in FIG. 25, but switches $\overline{DT}$ and DT4 as the input signal DT0 of the delay circuit 171 by each switch 177. The reason for this is as follows.

The above-described operation of the encoder/decoder for correcting the error is divided into the operation in which it operates in the synchronized relation with $\overline{DT}$ (taking in of the input data and the output of the corrected data) and the operation in which it operates without the $\overline{DT}$ being applied (generation of the syndrome or the like). Consequently, $\overline{DT}$ in the first case and $\overline{DT4}$ in the latter case (in this case ring oscillator) are designed to become the input signal of the group of delay circuits 171. This switching is effected by controlling the switch 177 by the output of the counter 173.

Furthermore, this circuit plays an role to generate the data transfer request signal $\overline{DTR}$. Timings when the DTR is generated are immediately after the driving signal CS3 has been received (in the case of writing) and when the generation of the syndrome has been completed (in the case of reading). $\overline{DTR}$ is reset by the application of the first $\overline{DT}$.

When the generation of the timing signal is finished, this circuit sends out the signal CS4 to inform the fourth timing generation circuit 15 of the completion of the operation.

Next, the fourth timing pulse generator 15 drives the third timing pulse generator 14 by issuing the signal CS5. The third timing pulse generator 14 generates the timing signal for driving the column register 5 in order to write the data stored within the column register 5 into the memory cell by converting it into the multilevel data. Since the construction of the circuit can be realized in accordance with the one shown in FIG. 25, the detailed description is omitted. This circuit issues the signal CS6 after the timing signal has been generated and informs the fourth timing pulse generator of the completion of the operation.

Then, after the fourth timing pulse circuit 15 has conducted the after-treatment, it makes the signal CS7 rise. As a result, CS0 to CS7 are sequentially reset and the cycle is completed.

Figure 27:
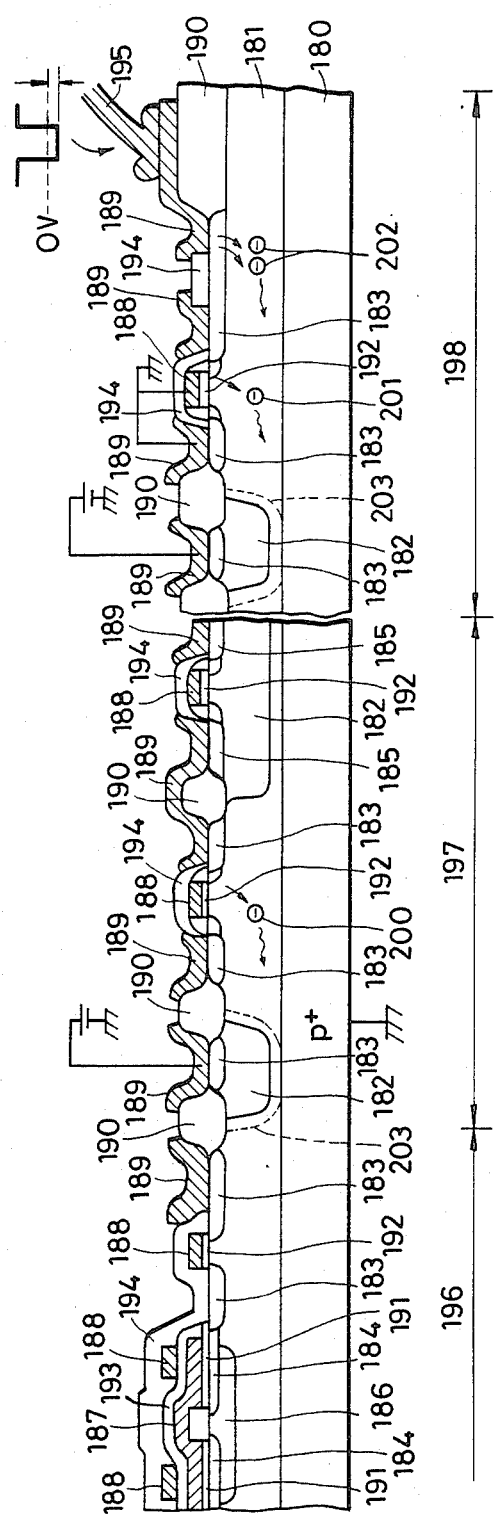
FIG. 27 shows a view illustrating the construction of the section of the memory of the embodiment according to the present invention.

Next, the construction of the device is described. FIG. 27 is an embodiment, illustrating the specific cross section. In the same figure, 180 is a p$^+$ layer, 181 a p-type epitaxially grown layer, 182 a n-well, 183 and 184 n$^+$ diffusion layers, 187 a gate of the first layer, 188 a gate of the second layer, 189 an Al wiring, 190 a device isolating region, 191 a first layer gate insulating film, 192 a second layer gate oxidized film, 193 and 194 an interlayer insulation film and 195 a bonding wire. 196 is a portion of the memory array, 197 a portion of the peripheral circuit and 198 a portion of the input circuit.

One of features of this construction of the device lies in that the p/p$^+$ epitaxial grown substrate is used for grounding the substrate. As described above, since, when the potential of the substrate is fluctuated, it can cause the erroneous operation, the impedance of the substrate is preferably low as far as possible. For that purpose, the potential of the substrate is preferably connected (in this case grounded) to the power supply having the low impedance rather than is imparted by the circuit such as the substrate voltage generator. Furthermore, the use of the epitaxially grown substrate is also effective for reducing the impedance of the substrate.

The other feature of this construction of device lies in that n-wells are provided between the memory array and the peripheral circuit and between the peripheral circuit and the input circuit and are biased by the positive voltage. This is for preventing the minority carries (in this case electrons) being rushed into the memory array, reaching its storage capacitance and the stored data being lost. These minority carriers are divided into those generating from the MOS transistor in the peripheral circuit or the input circuit, as shown in 200 and 201 and those generating from the input terminal, as 202. (If there is any undershoot in the input voltage, the junction between n$^+$−p substrates is set in the or ward direction.) If the memory array had been surrounded by the biased n-wells, the mountain of the potential is created there and the invasion of the minority carriers can be prevented. Furthermore, since minority carriers are very likely to occur especially around the input circuit, it is effective to surround it by n-wells to prevent generated carriers from being diffused. In particular, when, as shown in the figure, the epitaxially grown substrate is used, the invasion of the minority carriers can be effectively and completely prevented by designing the circuit in such a way that the depletion layer 203 which is formed by biasing the n-wells may reach the p+ layer.

Occidentally, these n-wells can be made in accordance with the ordinary CMOS process without using the special process.

Figure 28:
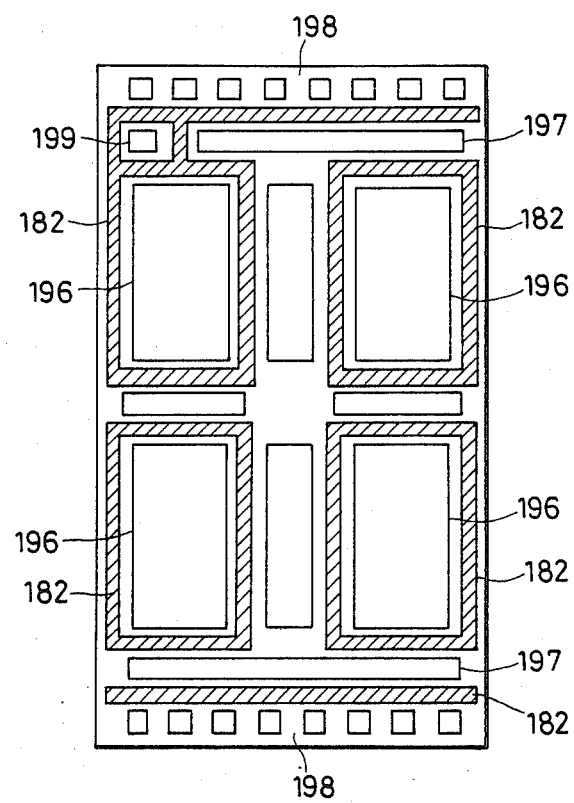
FIG. 28 shows a view illustrating the construction of the plane of the memory of the embodiment according to the present embodiment, FIGS. 29, 30 and 31 respectively show a voltage regulator.

FIG. 28 is an embodiment, illustrating the construction of the plane when this construction of the device is applies to the four mats memory. The n-wells 182 are provided around the memory array 196 and between the input circuit 198 and the other portion. Furthermore, since digital circuit and analog circuits (for example the above-described stepped wave voltage generator) are mixedly present on the same board, n-wells surround the analogue circuit 199. Though not shown in the figure, the circuit as having the high impedance node, for example, the above-described column register may be surrounded by n-wells.

Figure 29:
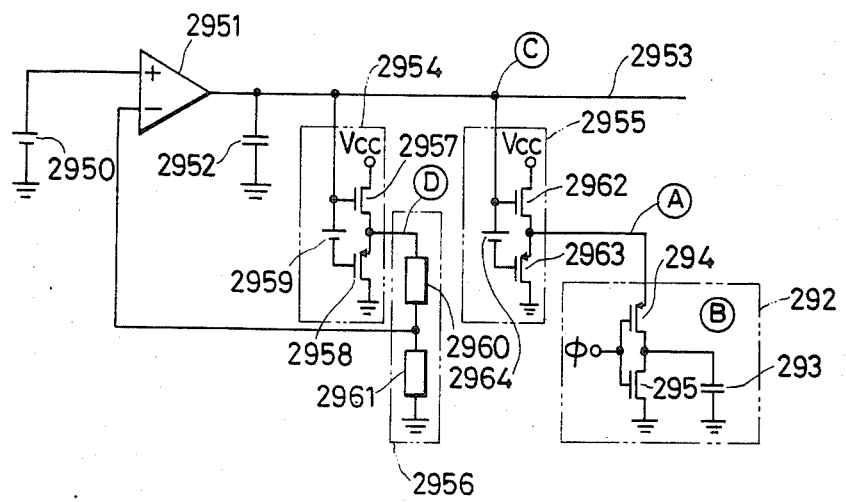

Next, the voltage regulator 16 is described. FIG. 29 is a circuit diagram of the one embodiment according to the present invention, and FIG. 30 a waveform diagram of the operation of the circuit shown in FIG. 27. In FIG. 29, 2950 is a reference voltage source, 2951 a differential amplifier, 2952 a smoothing capacitance, 2954 and 2955 a current buffer and 2956 a voltage divider. Furthermore, the current buffer is composed of the push-pull circuit comprising the N-channel MIS transistor of 2957 and the P-channel MIS transistor, and of the voltage source of 2959 as the bias means. Furthermore, the voltage divider is compose of, for example, resistances (load elements 2960 and 2961 of the MIS transistor or the like).

The voltage value of the voltage source constituting the current buffer is chosen larger than the sum of the gate threshold voltages in the N-channel and P-channel MIS transistors, so that the current may constantly flow through the push-pull circuit. As a result, to the terminal Ⓓ is output the value obtained by subtracting the threshold voltage $V_{TH}$ of the N-channel MIS transistor 57 from the voltage of the input (terminal Ⓒ). If the voltage dividing ratio of the voltage divider 2956 is assumed to be $1/n$ ($n \geq 1$) and the reference voltage value $V_R$, voltages of the terminal Ⓓ and the terminal Ⓒ can be represented respectively as:

$$V_{Ⓓ} = n \times V_R$$

$$V_{Ⓒ} = n \times V_R + V_{TH}$$

Consequently, as the current buffer 2955 for driving the load circuit 292 (294, 295: CMOS driver, 293: load capacitance) the same one as 2954 is used, so that the feed voltage which is output to the terminal Ⓐ may become $V_{Ⓐ} = n \times V_R$ which is proportional to the reference voltage.

Figure 30:
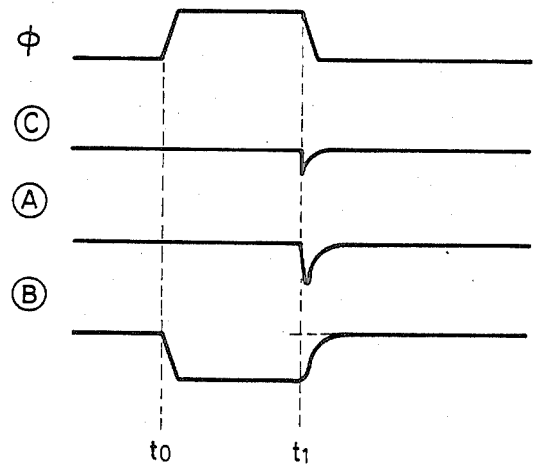

FIG. 30 is a waveform diagram of the operation of each part when the load circuit is operated. If the clock $\phi$ becomes High at the timing $t_0$, the voltage of the load capacitance becomes the grounding voltage. When the clock $\phi$ becomes Low at the timing $t_1$, the load capacitance is charged via the transistor 4. At this time, the characteristic of the rise of the voltage at the end of the load capacitance Ⓑ is governed by the current characteristic of the transistor 62.

In general, if the value of the current which flows through the transistor is the same, when the transistor is made to operate in the subthreshold region, the transmission conductance of the transistor becomes greatest and the large load driving capacity can be obtained. Consequently, the width of the channels of the transistors 62 or 63 is designed largely to a certain extent, so that they may operate in the subthreshold region under the predetermined bias current.

First, the response characteristics of the circuit is described when the fluctuation of the voltage at the terminal caused by the capacity coupling between the gate and the source of the transistor 62. At this time, if the value of the load capacity is assumed to be $C_L$ and the bias direct current I, the settling time $t_{SET}$ can be calculated as follows.

$$t_{SET} 0.1 \times \frac{C_L}{I}$$

In this case, the settling time is defined as the time required until the voltage reaches the range of $\pm 1$ mV of the final stabilized voltage. Furthermore, the subthreshold coefficient $\alpha$ of the transistor (amplitude of the voltage to be applied to the intermediate portion between the gate and the source which is required for changing the current which flows through the transistor by one digit) is assumed to be 0.1 V/decade. For example, when 10 pF is given as the value of the load capacity and 10 $\mu$A as the value of the bias current, an extremely high speed response is achieved, having the settling time $t_{SET} \approx 100$ ns. When the high speed response is aimed at by the low power consumption, it is practical to set the value of $I/C_L$ to $5 \times 10^5$ to $5 \times 10^7$, taking into consideration the matching with other circuits on the chip.

Furthermore, since the push-pull circuit is used as the current buffer, the high speed response can be realized with respect to the above-described fluctuation of the voltage in the negative direction as well as that in the positive direction, which permits the convergence to the stabilized voltage. Consequently, it is excellent also from the point of the noise-proof performance.

Now, when the load capacity is charged, the voltage of the output (terminal Ⓐ) in the voltage stabilization circuit, but the voltage of the terminal Ⓒ is also correspondingly transitionally decreased by the capacity coupling between the gate and the source of the transistor 62. Since the current feed capacity of the reference voltage source 51 is small, the voltage at the point Ⓒ is recovered by the capacity coupling along with the rise of the voltage at the point Ⓐ. In order to make the current buffer operate at a high speed, it is desirable to enlarge the voltage between the gate and the source (difference of the voltage between terminals Ⓒ and Ⓐ) of the transistor 62 as much as possible. For that purpose, it is necessary to lessen the transitional fluctuation of the voltage of the terminal Ⓒ as much as possible. According to the present invention, that purpose is achieved by providing the smoothing capacity. If the gain constant of the transistor 62 is assumed to be $\beta$, the capacity between the gate and the source $C_{GS}$, and the smoothing capacity $C_R$, the time constant $\tau$ which exhibits the response of the output voltage in the voltage stabilization circuit can be represented as follows.

$$\tau \approx \frac{2C_L}{\beta}\left(1 + \frac{C_{GS}}{C_R}\right)$$

Consequently, if $C_R$ is set to a sufficiently large value compared with $C_{GS}$, the high speed response can be secured. Since $C_{GS}$ is about one half of the gate capacity $C_G$, it is necessary to set the ratio of $C_R$ relative to $C_G$ ($C_R/C_G$) to the value larger than 0.3. When the ratio occupied by the smoothing capacity in the voltage stabilization circuit, it is practical to set the value $C_R/C_G$ to 0.5 to 50.

Furthermore, if, in this way, the smoothing capacity is provided to the terminal Ⓒ to lessen the fluctuation of the voltage, it also becomes possible to drive a plurality of loads by providing a plurality of current buffers with a single reference voltage source. Namely, when a single load is charged, the voltage of the other load can be prevented from being simultaneously reduced.

Figure 31:
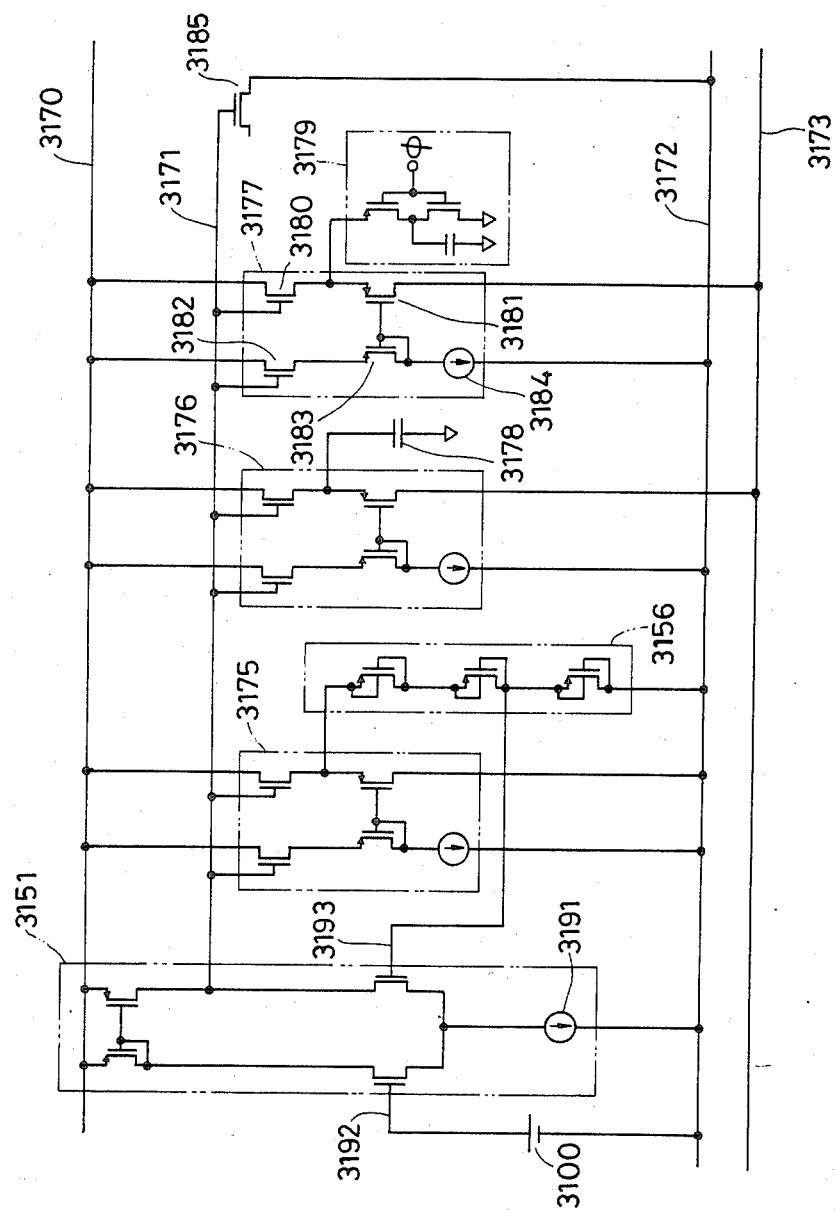

FIG. 31 is a more specific circuit schema of one embodiment according to the present invention shown in FIG. 29.

In the same figure, reference numeral 3151 is a differential amplifier, 3175, 3176 and 3177 current buffers, 3178 and 3179 loads, and 3185 a smoothing capacity.

The current buffer is composed of the push-pull circuit comprising the N-channel MIS transistor 3180 and the P-channel MIS transistor, and of the bias means comprising the MIS transistors 3182 and 3183 and the constant current source 3184. In order to feed the direct bias current to the push-pull circuit, it is necessary to apply the voltage equivalent to the sum of the absolute values of each threshold voltage between gates of the transistors 3180 and 3181. According to the present invention, a source follower circuit by the transistor 3182 is used and its load is used as the P-channel MIS transistor which is connected in the form of the diode (The gate and the drain are connected), so that the predetermined voltage may be applied to the gate of the transistor 3181. It is assumed that the length of the channels of transistors 3180 and 3182 is equal, the ratio of the width of channels n, while the lengthes of channels of transistors 3181 and 3181 are equal and the ratio of its channels is n. Furthermore, if the value of current of the constant current voltage 84 is assumed to be $I_R$, the direct bias current I which flows through the push-pull circuit becomes as follows.

$$I \approx n \times I_R$$

Consequently, if this value n is properly chosen relative to the value of the driven load capacity, the necessary speed performance can be obtained. Furthermore, according to this invention, the gate capacity of the MIS transistor is used as the smoothing capacity. As a result, the large capacity can be efficiently obtained with a small area.

Meanwhile, in FIG. 31, the reference voltage source 3100 is a band gap reference voltage generator. Furthermore, in the differential amplifier, 3191 is a constant current source, 3192 a non-inversed input and 3193 an inversed input.

In general, irrespective of the natures of circuits (MIS integrated circuit or the bipolar integrated circuit), the reference voltage generator which is most excellent in the temperature stability is a band gap reference voltage generator. Its stabilized voltage is about 1.26 V under the condition of the room temperature (25° C.=298K). In this example, the value three times as large as the band gap reference voltage 1.26 V, i.e. 3.78 V is obtained to the output of the current buffer by using this reference voltage generator and, further, the voltage divider having the voltage division ratio ⅓. In MIS-LSI, the stabilized voltage which is within the range of the most popularly used power voltage 5 V and which is high as far as possible is preferably around 4 V from the point of the excellent operation of the circuit. As the voltage division ratio, except for the one ⅓ as shown here, diffusion layer resistances or the like, for example, are used for obtaining the any value. However, since the layer resistance of the diffusion layer is generally low, the large areas is occupied to obtain the high value of the resistance. Consequently, as in this example, when the divisor of the voltage division ratio is an integer, it is desirable to use the MIS transistor from the point of economizing the area. For the channel resistance of the MIS transistor is high. If the MIS transistor having the same length of the gate and the same width of the gate is used, the voltage dividing ratio having the integral divisor can be easily obtained. In that case, as in this example, if the board of each transistor constituting the voltage divider is separated and is connected to the source, the more accurate ratio can be obtained without undergoing the board bias effect. To separate the board in such a way, in the N-well C-MIS integrated circuit, wells may be separated for constructing the MIS transistors. Similarly, in the P-well C-MIS integrated circuit, the voltage divider may be constructed of the N-channel MIS transistor. If characteristics of current buffers 3175, 3176 and 3177 are available, 3.78 V is fed to loads 3178 and 3179.

Furthermore, according to the present invention, the wiring of the grounded voltage is divided into 3172 which passes only the stationary current and 3173 which passes the current at the time of switching. As a result, since the current flows to the grounding wiring in accordance with the switching action of the load and the voltage of the grounded wiring is elevated, the stabilized voltage is prevented from being fluctuated.

Figure 32:
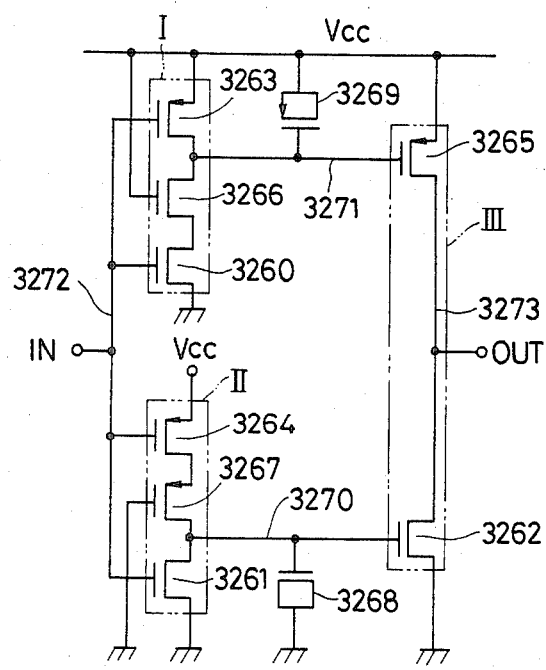
FIGS. 32 and 33 show a diagram of the delay circuit which is used within the timing generator.

FIG. 32 is a view, illustrating one embodiment of the delay circuit in FIGS. 25 and 26. In Figs., 3260 to 3262 are NMOS transistors, 3263 to 3265 PMOS transistors, 3266 and 3267 respectively NMOS and PMOS transistors as the resistance elements, 3268 and 3269 NMOS and PMOS transistors as the capacity elements, 3270 and 3271 respectively nodes of the gate of the NMOS and PMOS transistors at the output stage, 3272 an input and 3273 an output.

Figure 33:
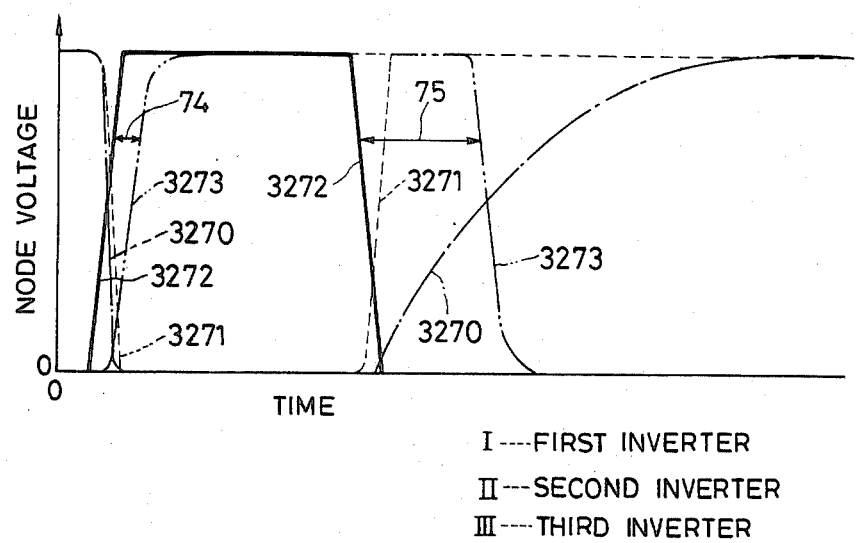

FIG. 33 shows a view, illustrating the waveform of the voltage of each node in the delay circuit shown in FIG. 32. Reference numerals attached in the figure correspond to the numbers of each node in FIG. 32. How the delay 3374 of the rise and the delay of trailing of the pulse shown in FIG. 33 are set is described as follows.

First, the delay of the rise can be set through the delay until the node voltage of the gate 71 of the PMOS transistor of the third inverter III falls below the level of the threshold voltage of this PMOS transistor. This delay can be created by the discharge time of the node 3271 from "High" to "Low" through the NMOS transistor 3260 which is controlled by the time constants of the channel resistance of the NMOS transistor 3266 and of the gate capacity of the PMOS transistor 3269. Meanwhile, the delay of the rise can be set by the delay until the node voltage of the gate 3270 of the NMOS transistor of the third inverter III rise above the threshold voltage of this NMOS transistor. This delay can be created by the charge time of the node 3270 from "Low" to "High" through the PMOS transistor 64 which is controlled by the time constants of the channel resistance of the PMOS transistor 3268 and of the gate capacity of the NMOS transistor 3268.

As described above, the delay of the rise of pulse can each be independently set by the discharge time which is decided by the channel resistance of the NMOS transistor 3266 as the resistance element and by the gate capacity of the PMOS transistor 3269 as the capacity element, while the delay of the trailing by the charge time which is decided by the channel resistance of the PMOS transistor 3267 as the resistance element and by the gate capacity of the NMOS transistor 3268 as the capacity element.

As seen from FIG. 32, since this delay circuit imparts the delay output by the single input and the timing control pulse is not necessary, it is extremely simple and useful. Furthermore, according to the delay circuit shown in FIG. 32, the delay for a long time as well as for a short time can be realized and is extremely efficient by choosing the channel resistance and the gate capacity. Furthermore, referring to the waveform of the node voltage shown in FIG. 33, since, when the PMOS transistor 3265 set to the "ON" state, the NMOS transistor 3262 of the third inverter is already in the "OFF" state and when the NMOS transistor 3262 has been set to the "ON" state, the PMOS transistor 3265 of the third inverter has already been in the "OFF" state, the current does not flow between the power supply and the grounded portion and as a result, the power consumption is small.

In this case, PMOS and NMOS transistors of the third inverter in FIG. 32 are output buffers, but when the load is heavy, PNP and NPN bipolar transistors can also be used. Even if the MOS transistor is not used, the diffusion layer resistance or the capacity ranging from the electrode and the insulation film to the electrode (M-I-M capacitor) may be used for the resistance element or the capacity element. However, the MOS transistor has a great advantage that it can offer the great resistance though its resistance is comparatively small.

So far the present invention was described in accordance with the embodiment. In Figs. of the above described embodiment, the source of the MIS transistor to which the arrow is attached denotes the P-channel MIS transistor and the others the N-channel MIS transistors.

As described above, according to the present invention, the low power consumption X-Y address type multilevel data memory is provided having the amplifier which is suited to the large capacity memory and of an extremely simple construction and yet which can amplify the minute voltage by the low voltage driving pulses, and a mechanism for reading and writing the high accuracy multilevel data which is also small in the size of the circuit and is suitable for the high degree of integration and which can be driven at the low voltage. As a result, the semiconductor file memory having the ultrahigh density which is desired for the small type computer system can be realized and the performance of the small storage in which the semiconductor is used—for IC cards—can be improved greatly.

What is claimed is:

1. A semiconductor multilevel data memory comprising;
    an array comprising a plurality of memory cells each having at least a single capacitors,
    a selective means for sequentially selecting each memory cell in a predetermined order,
    data lines which are connected to said memory cells for transmitting the data,
    a mechanism for writing the data connected to the data lines,
    a mechanism for reading the data which is connected to the data lines and having a column register having at least a data deciding mechanism, a transfer gate provided between said deciding mechanism and the above-described data lines, and a bias charge feed mechanism provided between said transfer gate and said deciding mechanism which is provided with,
    at least, two or more memory elements for temporarily storing the above-described data,
    a voltage generator generating in a time series three values or more voltages which are different from each other and a means for applying said voltages to said memory cells,
    a means for performing the input and output of the data in a synchronized relation with a clock signal which is to be applied from the exterior of the semiconductor multilevel data memory device, and,
    a means for issuing a signal indicating that preparation of the input and output of the data has been completed.

2. A semiconductor multilevel data memory device as defined in claim 1, wherein said column register has at least a first and a second column registers each having a plurality of memory elements to be selected, said first column register having a first means for storing in parallel the binary data which corresponds to the multilevel data read out from said memory cells, a second means for storing the binary data corresponding to the data written from the exterior of said multilevel data memory device into the memory elements comprising a selected memory element of the first column register, and a third means for feeding said stored binary data as the digital data representing the multilevel data into said write mechanism, said second column register having a fourth means for storing the binary data corresponding to multilevel data read out from said memory cell and a fifth means for reading out in parallel the binary data from the selected memory element of the second column register.

3. A semiconductor multilevel data memory device, as defined in claim 1, wherein said voltage generator has at least an inversion amplifier having an input and an output, a feedback capacitor which is connected between the input and the output of said inversion amplifier, a means for setting the operating point which is similarly connected to the input and the output of the inversion amplifier and which sets the operating point of said inversion amplifier, and a plurality of driving capacitors each having one end which is connected to the input of said inversion amplifier, the value of the voltage corresponding to a combination of driving pulses having two levels (high and low) of voltages which are each applied to another end of said driving capacitors connected to the input of said inversion amplifier.

4. A semiconductor multilevel data memory device, as defined in claim 3, wherein values of said plurality of driving capacitors are respectively equal to each other.

5. A semiconductor multilevel data memory device, as defined in claim 3, wherein said means for setting the operating point has at least a switch which is provided to short-circuit the input and the output of said inversion amplifier when the operating point is set.

6. A semiconductor multilevel data memory device, as defined in claim 3, wherein said inversion amplifier has at least one N- or P-channel insulation gate (MIS) transistor and a load element.

7. A semiconductor multilevel data memory device, as defined in claim 3, wherein said inversion amplifier comprises an inversion amplifying means which comprises a single N- or P-channel MIS transistor and a single load element, the gate of said MIS transistor being taken as the input, and the drain of said MIS transistor being taken as the output, and a non-inversion amplifying means for taking the output of said inversion means as the input, the input of said inversion amplifier means and the output of said non-inversion amplifying means being taken respectively as the input and the output.

8. A semiconductor multilevel data memory device, as defined in claim 7, wherein said non-inversion amplifying means comprises a push-pull circuit having at least one N-channel and one P-channel MIS transistors, and at least one bias applying means which is provided for the purpose of feeding the direct current stationarily to said push-pull circuit.

9. A semiconductor multilevel data memory device, as defined in claim 7, wherein said non-inversion amplifying means has at least a push-pull circuit comprising at least one N-channel MIS transistor and one PNP bipolar transistor, or at least one P-channel MIS transistor and one NPN bipolar transistor, and at least one bias applying means which is provided for the purpose of stationarily feeding the direct current to said push-pull circuit.

10. A semiconductor multilevel data device, as defined in claim 1, wherein the number of data lines is an integral multiple of the number of levels which is stored within said memory cells.

11. A semiconductor multilevel data memory device, as defined in claim 1, wherein an epitaxially grown board is used as the board, said board being connected to an external power supply and wells being provided around said array or around the input circuit.

12. A semiconductor multilevel data memory device, as defined in claim 1, comprising a mechanism for correcting data error by use of multidimensional codes.

13. A semiconductor multilevel data memory device, as defined in claim 1, wherein said data lines are divided into a plurality of portions and one of the plurality of portions is connected to said writing mechanism and said reading mechanism.

14. A semiconductor multilevel data memory device, as defined in claim 1, wherein said deciding mechanism has at least a first pair of MIS transistors in which the drain and the gate are coupled, a second pair of MIS transistors which are electrically conductive in contact to said first pair, and a means for switching said first pair and said second pair.

15. A semiconductor multilevel data memory device, as defined in claim 1, comprising a first timing signal for driving at least said reading mechanism and said column register, a second timing pulse generator for generating at least a timing signal which is synchronized with said clock signal, and a third timing pulse generator for driving at least said writing mechanism and said column register.

16. A semiconductor multilevel data memory device, as defined in claim 15, wherein said first, second, third and a fourth timing pulse generators respectively have at least a delay circuit, combination logic circuit and a counter.

17. A semiconductor multilevel data memory device, as defined in claim 15, having a control mechanism for driving said first timing pulse generator in response to a chip selecting signal which is applied from the exterior of said device and driving said second timing pulse generator after the completion of the operation of said second timing pulse generator and driving said third timing pulse generator.

18. A semiconductor multilevel data memory device, as defined in claim 1, wherein said select means sequentially selects a portion of or the entire memory cell on the same word line.

19. A semiconductor multilevel data memory device, as defined in claim 1, having a mechanism for correcting data error by the use of multidimensional cyclic code or multidimensional shortened cyclic code.

20. A semiconductor multilevel data memory device, as defined in claim 19, wherein memory cells storing the data which belongs to the same block of said code are not adjacent each other.

21. A semiconductor multilevel data memory device, as defined in claim 1, having a reference voltage source which generates a first reference voltage, a differential amplifier in which the first reference voltage is taken as the non-inversion input and in which the signal is negatively fed back from the output to the inversed input through a feedback circuit which is composed of a first current buffer and a voltage divider, and, further, a regulator which is connected to the output of the differential amplifier for the purpose of driving the load circuit and having at least the same one buffer as the first one, so that a third reference voltage which is proportional to the first reference voltage may be fed to the load circuit, a smoothing capacitor being connected between the output of said differential amplifier and the grounding potential, so that the stabilized voltage from said regulator may be fed to said voltage regulator.

22. A semiconductor multilevel data memory device, as defined in claim 21, wherein said current buffer has at least a push-pull circuit which is composed of at least a N-channel and a P-channel MIS transistors, and a bias means for feeding the direct bias current to said push-pull circuit.

23. A semiconductor multilevel data memory device, as defined in claim 21, wherein said bias means is composed of a source follower of the N-channel or the P-channel MIS transistor in which the reference voltage is to be input and the load of said source follower is constructed such that the P-channel or N-channel MIS transistor in which the gate and the drain are connected may be serially connected with the constant current source.

24. A semiconductor multilevel data memory device, as defined in claim 16, wherein said delay circuit comprises a first and a second delay circuits and an output buffer having two transistors, said first and the second delay mechanisms each giving the time of the delay of the rise or trailing, pulses which have passed said delay circuits being transmitted to the output buffer by being individually applied to the gate of said two transistors.

25. A semiconductor multilevel data memory device, as defined in claim 24, wherein said delay mechanism is composed of a first and a second inversion gate having a resistance element or a serially connected MOS transistor and a first and a second capacitor which are each connected to the output terminal of said first and second inversion gate respectively, the input pulse being applied to the first and the second inversion gates, the output of the first inversion gate being connected to the input at the side of high potential of the output buffer and to the input at the side of low potential of the output buffer of the second inversion gate, so that the delay time of the rise of the output signal may be set by the resistance element of the first inversion gate and the first capacitor and the delay time of the trailing of the output signal may be set by the resistance element of the second inversion gate and the second capacitor.

26. A semiconductor multilevel data memory device, as defined in claim 1, wherein said means for issuing includes a terminal.

* * * * *